(12) United States Patent
Jen et al.

(10) Patent No.: US 10,453,409 B2
(45) Date of Patent: Oct. 22, 2019

(54) DRIVING CIRCUIT AND DISPLAY DEVICE WITH ENHANCED MOISTURE PREVENTION CAPABILITY

(71) Applicant: HannStar Display Corporation, Taipei (TW)

(72) Inventors: Tean-Sen Jen, Taoyuan (TW); Sung-Chun Lin, Tainan (TW); Hsuan-Chen Liu, Kaohsiung (TW); Chien-Ting Chan, Tainan (TW)

(73) Assignee: HannStar Display Corporation, Taipei (TW)

( * ) Notice: Subject to any disclaimer, the term of this patent is extended or adjusted under 35 U.S.C. 154(b) by 249 days.

(21) Appl. No.: 15/236,493

(22) Filed: Aug. 15, 2016

(65) Prior Publication Data

US 2017/0249916 A1 Aug. 31, 2017

(30) Foreign Application Priority Data

Feb. 26, 2016 (CN) .......................... 2016 1 0105944

(51) Int. Cl.
*G09G 3/36* (2006.01)
*H01L 27/12* (2006.01)
*G11C 19/28* (2006.01)

(52) U.S. Cl.
CPC .......... *G09G 3/3677* (2013.01); *G11C 19/28* (2013.01); *H01L 27/124* (2013.01); *H01L 27/1255* (2013.01); *G09G 2300/0426* (2013.01); *G09G 2310/0251* (2013.01); *G09G 2310/0286* (2013.01)

(58) Field of Classification Search
CPC ......... G09G 3/3677; G09G 2300/0426; G09G 2310/0251; G09G 2310/0286; G11C 19/28; H01L 27/124; H01L 27/1255
See application file for complete search history.

(56) References Cited

U.S. PATENT DOCUMENTS

| 8,310,432 | B2 | 11/2012 | Lee et al. |
| 9,245,891 | B2 | 1/2016 | Umezaki |
| 9,275,593 | B2 * | 3/2016 | Kim ...................... G09G 3/3677 |

(Continued)

FOREIGN PATENT DOCUMENTS

| CN | 1758197 A | 4/2006 |
| CN | 101910932 A | 12/2010 |

(Continued)

*Primary Examiner* — Kwang-Su Yang
(74) *Attorney, Agent, or Firm* — CKC & Partners Co., LLC

(57) ABSTRACT

The present invention provides a driving circuit and a display device. The driving circuit is disposed on a substrate of the display device. The driving circuit includes thin film transistors (TFTs), a capacitor and clock signal lines. Each of the TFTs includes a gate, a source and a drain. The capacitor is coupled to at least one of the TFTs, and includes a first and a second electrode. The material of the first and the second electrode includes a transparent conductive material. The clock signal lines extend along a first direction. The source and the drain of at least two of the TFTs respectively extend along a second direction. The angle between the first direction and the second direction is between 80 degrees and 100 degrees. At least a partial structure of the capacitor is located in a gap between adjacent ones of the TFTs.

19 Claims, 15 Drawing Sheets

(56) References Cited

U.S. PATENT DOCUMENTS

| | | | | |
|---|---|---|---|---|
| 9,601,073 | B2* | 3/2017 | Chae | G09G 3/3677 |
| 9,620,531 | B2* | 4/2017 | Jin | H01L 27/124 |
| 2003/0222311 | A1* | 12/2003 | Kim | G02F 1/13454 |
| | | | | 257/347 |
| 2010/0177270 | A1 | 7/2010 | Nakagawa | |
| 2011/0031498 | A1 | 2/2011 | Kimura et al. | |
| 2014/0049712 | A1* | 2/2014 | Yu | G02F 1/13306 |
| | | | | 349/34 |
| 2015/0070616 | A1* | 3/2015 | Ogasawara | G02F 1/1339 |
| | | | | 349/43 |
| 2015/0235584 | A1* | 8/2015 | Eom | G09G 3/3233 |
| | | | | 345/213 |

FOREIGN PATENT DOCUMENTS

| | | |
|---|---|---|
| CN | 102227765 A | 10/2011 |
| CN | 104483771 A | 4/2015 |
| TW | 562982 B | 11/2003 |
| TW | 589480 B | 6/2004 |
| TW | 201234253 A | 8/2012 |

* cited by examiner

DRIVING CIRCUIT AND DISPLAY DEVICE WITH ENHANCED MOISTURE PREVENTION CAPABILITY

RELATED APPLICATIONS

This application claims priority to Chinese Patent Application Serial Number 201610105944.4, filed on Feb. 26, 2016, which is herein incorporated by reference.

BACKGROUND

Field of the Invention

The present invention relates to a driving circuit, and more particularly to a driving circuit disposed on a system on glass (SOG) and a display device including the same.

Description of Related Art

With advancing development technologies of thin film transistor (TFT) liquid crystal display, technologies of integrating a driving circuit (e.g. a gate driving circuit) on a display panel, such as a system on glass (SOG) technology, have widely applied to conventional display devices, in order to minimize the size and improve the performance of the display devices. However, the gate driving circuit would generate a parasitic capacitance with a common electrode or another electrode of a display panel, and the generated parasitic capacitance would induce an abnormal operation of the gate driving circuit and thereby cause a display issue.

In order to solve the parasitic capacitance issue, a sealant may be disposed directly on the gate driving circuit. The dielectric constant of the sealant is smaller than the dielectric constant of the liquid crystal molecules, and therefore the parasitic capacitance can be effectively reduced by directly disposing the sealant on the gate driving circuit. However, during a light curing process on the sealant, the gate driving circuit would block light illuminating from the bottom side of the display panel, such that the quantity of light penetrating through the gate driving circuit into the sealant is insufficient, thus causing the sealant incomplete cured. As such, external moisture would easily permeate through the sealant into the internal of the display device to erode the electrical components of the gate driving circuit, thus resulting in a reliability issue and service life reduction of the display device.

SUMMARY

An objective of the invention is to provide a driving circuit, in which the capacitor of transparent conductive material is disposed between the thin-film transistors (TFTs) for increasing light transmittance. A display device with a system on glass (SOG) applying such driving circuit can improve its bonding effect and effectively block external moisture from permeating into the internal of the display device, so as to prevent moisture from eroding the electrical components of the driving circuit and then resulting in an abnormal operation of the driving circuit.

One aspect of the present invention is directed to a driving circuit. The driving circuit is disposed on a substrate of a display device. The substrate has a display region and a non-display region, and the driving circuit is disposed in the non-display region. The driving circuit includes TFTs, a capacitor and clock signal lines. Each of the TFTs has a gate, at least one source and at least one drain. The capacitor is coupled to at least one of the TFTs. The capacitor has a first and a second electrode each including a transparent conductive material. The signal lines are respectively configured to provide clock signals to at least one of the TFTs. The clock signal lines extend along a first direction. The source and the drain of at least two of the TFTs extend along a second direction. An angle between the first direction and the second direction is between 80 degrees and 100 degrees. The capacitor is at least partially located in a gap between adjacent ones of the at least two TFTs.

In one embodiment of the present invention, the first direction is substantially perpendicular to the second direction.

In one embodiment of the present invention, the at least two TFTs comprise N number of TFTs sequentially disposed along the first direction, a gate, a source and a drain of the (i−1)th TFT are electrically connected to a gate, a source and a drain of the i-th TFT, respectively, and the capacitor is at least partially located in a gap between the (i−1)th and i-th TFTs, where N is an integer greater than or equal to 2 and i is an integer greater than or equal to 2 and smaller than or equal to N.

In one embodiment of the present invention, each of the N number of TFTs includes a gate, two sources and a drain. For each of the N number of TFTs, the sources are respectively disposed at two opposite sides of the drain.

In one embodiment of the present invention, the gate and the source of the N number of TFTs are respectively electrically connected to the first and the second electrode of the capacitor.

In one embodiment of the present invention, the driving circuit includes at least one shift register circuit. The shift register circuit includes a pull-up unit with the N number of TFTs and the capacitor.

In one embodiment of the present invention, the shift register circuit further includes a pre-charge unit and at least one pull-down unit. The distance between the pull-up unit and the display region is longer than the distance between the pre-charge unit and the display region and is longer than a distance between the pull-down unit and the display region.

In one embodiment of the present invention, the clock signal lines are disposed between a side of the substrate and the N number of TFTs.

In one embodiment of the present invention, the clock signal lines are disposed between the N number of TFTs and the display region.

In one embodiment of the present invention, a connecting line and one of the clock signal lines are electrically connected by a connecting structure. The connecting line is electrically connected to the N number of TFTs. The distance between the connecting structure and a side of the substrate is at least 600 micrometers. The connecting structure is configured to electrically connect different metal layers.

In one embodiment of the present invention, the connecting structure includes a transparent conductive layer, the clock signal lines are formed from a first metal layer, the connecting line is formed from a second metal layer, and the transparent conductive layer is electrically connected to the connecting line and one of the clock signal lines.

In one embodiment of the present invention, the driving circuit further includes a first connecting line and a second connecting line. The first connecting line is coupled to the source of the N number of TFTs. The second connecting line has a first portion coupled to the drain of the N number of TFTs and a second portion extending towards the display region to electrically connect one of the clock signal lines.

In one embodiment of the present invention, the driving circuit further includes a third connecting line. The third connecting line has a first portion coupled to the source of one of the N number of TFTs and a second portion extending towards the display region.

In one embodiment of the present invention, the capacitor and the TFTs are non-overlapped in a direction perpendicular to the substrate.

In one embodiment of the present invention, the transparent conductive material includes indium tin oxide (ITO), indium zinc oxide (IZO) or tin oxide.

Another aspect of the present invention is directed to a display device, which includes a first substrate, a second substrate and a sealant. The first substrate has a display region and a non-display region. A driving circuit having TFTs, a capacitor and clock signal lines is disposed in the non-display region. The driving circuit includes TFTs, a capacitor and clock signal lines. Each of the TFTs has a gate, at least one source and at least one drain. The clock signal lines extend along a first direction. The source and the drain of at least two of the TFTs extend along a second direction. The capacitor has a first and a second electrode each including a transparent conductive material. The capacitor is at least partially located in a gap between adjacent ones of the at least two TFTs. An angle between the first direction and the second direction is between 80 degrees and 100 degrees. The second substrate is disposed opposite to the first substrate and has a non-transparent region. The sealant is disposed between the first substrate and the second substrate. The sealant, the driving circuit and the non-transparent region are at least partially overlapped in a direction perpendicular to the first substrate or the second substrate.

In one embodiment of the present invention, the driving circuit includes at least one shift register circuit.

In one embodiment of the present invention, the at least two TFTs include N number of TFTs sequentially disposed along the first direction, where N is an integer greater than or equal to 2. A gate, a source and a drain of the (i−1)th TFT are electrically connected to a gate, a source and a drain of the i-th TFT, respectively, the capacitor is at least partially located in a gap between the (i−1)th and i-th TFTs, and the N number of TFTs and the sealant are overlapped, where i is an integer greater than or equal to 2 and smaller than or equal to N.

In one embodiment of the present invention, the clock signal lines are disposed between a side of the first substrate and the N number of TFTs.

In one embodiment of the present invention, the clock signal lines are disposed between the N number of TFTs and the display region.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the present invention is described as following. The described preferred embodiments are presented for purposes of illustrations and description, and they are not intended to limit the scope of the present invention.

It will be understood that, although the terms first and second may be used herein to describe various elements, components, regions, layers and/or sections, these elements, components, regions, layers and/or sections should not be limited by these terms. These terms are only used to distinguish one element, component, region, layer or section from another element, component, region, layer or section.

Figure 1:
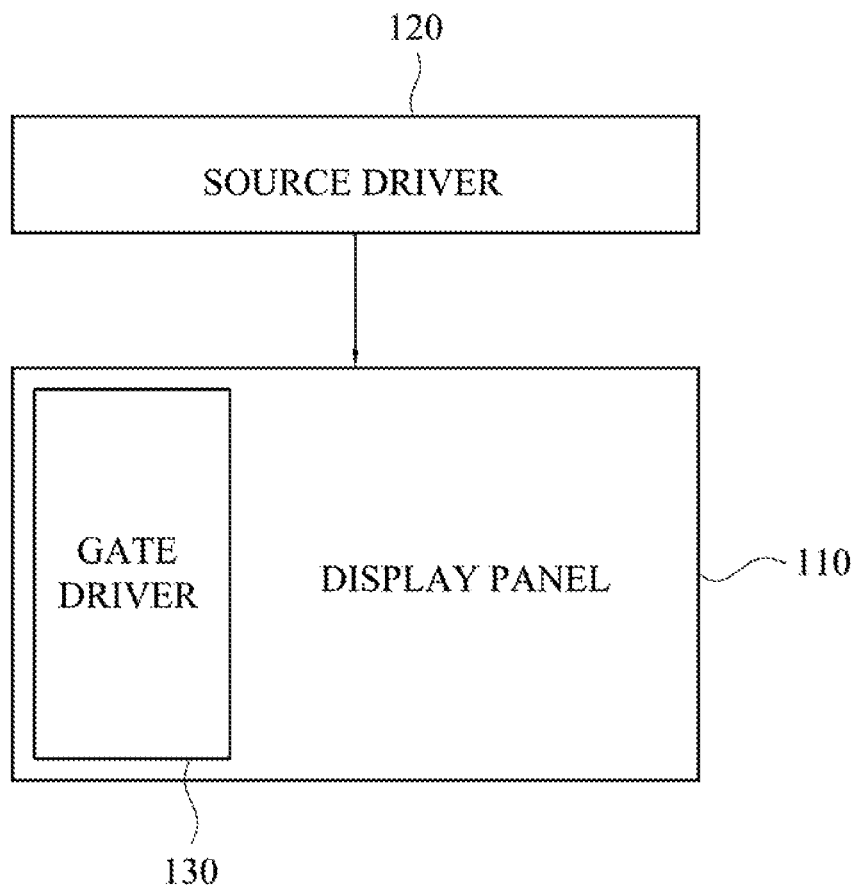
FIG. 1 illustrates a schematic diagram of a display device in accordance with some embodiments of the present invention.

Referring to FIG. 1, which illustrates a schematic diagram of a display device 100. The display device 100 includes a display panel 110, a source driver 120 and a gate driver 130. The display panel 110 includes pixels arranged in a matrix for collectively displaying an image. The display panel 110 may be, for example, a liquid crystal display (LCD) panel of twisted nematic (TN) mode, in-plane switching (IPS) mode, fringe-field switching (FFS) mode, vertical alignment (VA) mode or any other different modes. The source driver 120 is electrically connected to the display panel 110, and is configured to convert image data into source driving signals and to transmit the source driving signals to the display panel 110. The gate driver 130 is configured to generate gate driving signals and to transmit the gate driving signals to the display panel 110. The display panel 110 displays an image by driving the source driving signals and the gate driving signals.

In the embodiments of the invention, the display device 100 is a system on glass (SOG) display device, i.e., the gate driver 130 is made in the display panel 110. As such, the electrical components of the gate driver 130 and the display panel can be formed together by the same process. For illustration, TFTs in a gate driving circuit of the gate driver 130 may be formed along with those in the display region of the display panel 110 by the same process.

Figure 2:
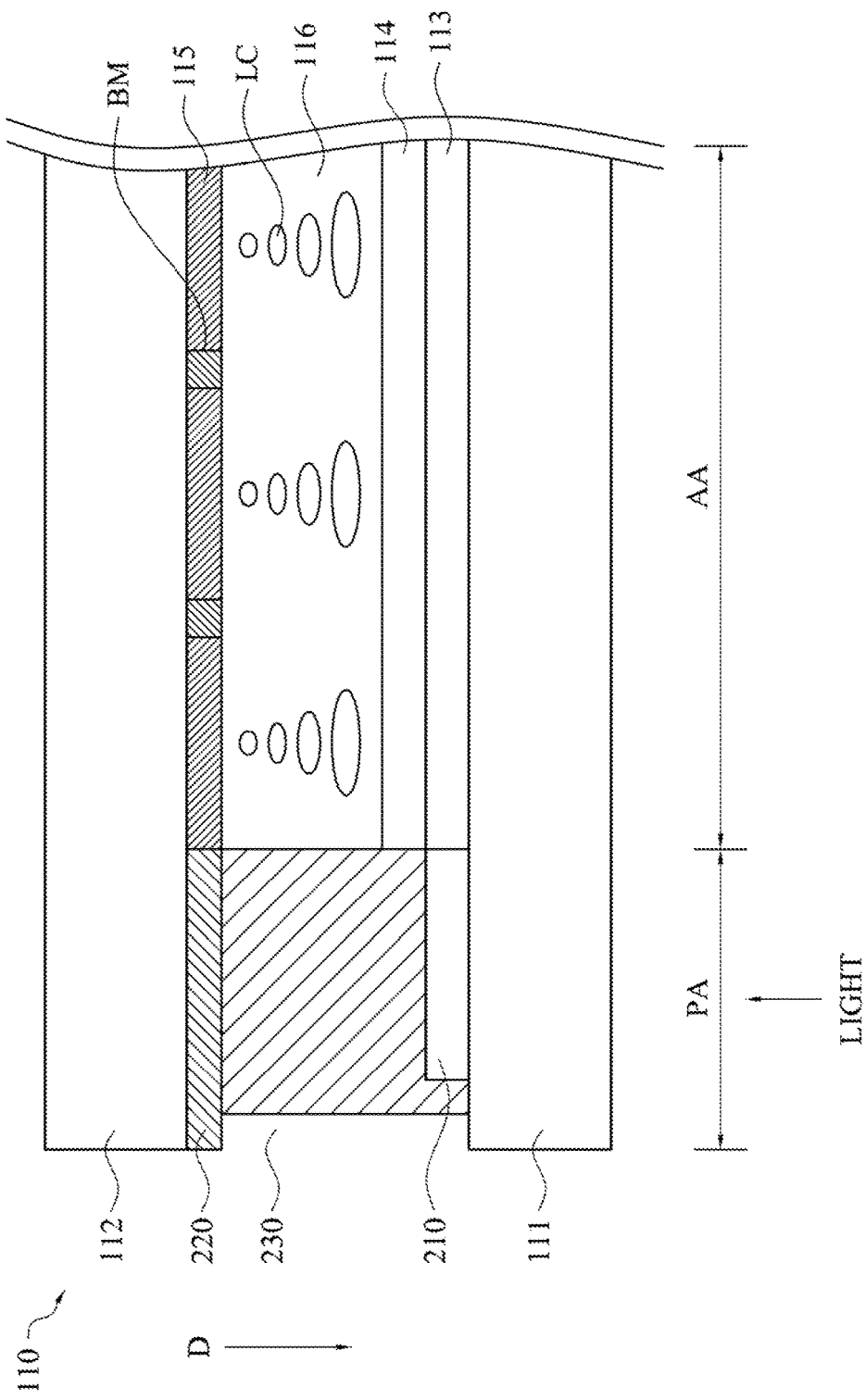
FIG. 2 illustrates a partial cross sectional diagram of the display device of FIG. 1.

Referring to FIG. 2, which illustrates a partial cross sectional diagram of the display panel 110 of FIG. 1. In FIG. 2, the display panel 110 includes a first substrate 111 (or called a TFT substrate) and a second substrate 112 (or called a color filter substrate), and the display panel 110 includes a display region AA and a non-display region PA. In the display region AA of the display panel 110, a TFT component layer 113 and a pixel electrode layer 114 are disposed on the first substrate 111, a color filter layer 115 and a black matrix BM are disposed on the second substrate 112, and a liquid crystal layer 116 is located between the pixel electrode layer 114 and the color filter layer 115. The liquid crystal layer 116 includes liquid crystal molecules which are correspondingly twisted by the internal electric field of the display panel 110. The internal of the display panel 110 further includes a common electrode layer (not shown) which is configured to interact with the pixel electrode layer 114 to generate an internal electric field, such that the liquid crystal molecules LC in the liquid crystal layer 116 are correspondingly twisted by the internal electric field. The common electrode layer (not shown) may be disposed at different locations based on the type of the display panel 110. For illustration, if the display panel 110 is a TN type LCD panel or a VA type LCD panel, the common electrode layer (not shown) and the pixel electrode layer 114 are respectively at two opposite sides of the liquid crystal layer 116; if the display panel 110 is an IPS display panel or a FFS display panel, the common electrode layer (not shown) and the pixel electrode layer 114 are at the same side of the liquid crystal layer 116.

In the non-display region PA of the display panel 110, a driving circuit 210 is disposed on the first substrate 111, a shielding layer 220 is disposed on the second substrate 112, and a photo-curable sealant 230 is disposed between the driving circuit 210 and the shielding layer 220 and is cured through illumination by light. Because the shielding layer 220 is disposed on the second substrate 112, light illuminates from the lower side of the first substrate 111 (i.e. the side of the first substrate 111 away from the liquid crystal layer 116), and then penetrates through the first substrate 111 to cure the photo-curable sealant 230. The driving circuit 210 may be the gate driver 130 of FIG. 1 and include at least one capacitor. In the driving circuit 210, the capacitor includes a first electrode, a second electrode and an insulating layer sandwiched between the first electrode and the second electrode. The first electrode and the second electrode include a transparent conductive material, such as indium tin oxide (ITO), indium zinc oxide (IZO), indium oxide, tin oxide or another suitable transparent conductive material, such that light can penetrate through the capacitor to cure the photo-curable sealant 230 which is disposed on the capacitor region. For example, in the embodiments of IPS type LCD panels or FFS type LCD panels, the first electrode and the second electrode of the capacitor may be formed together with the pixel electrode layer and the common electrode layer, respectively. The region at which the shielding layer 220 is disposed is a non-transparent region of the second substrate 112 for reflecting light for curing the photo-curable sealant 230 and blocking light from penetrating into the second substrate 112, so as to improve the curing efficacy of the photo-curable sealant 230. Further, in other embodiments of the present invention, the material of the shielding layer 220 is the same as that of the black matrix BM. In particular, in the direction D perpendicular to the first substrate 111 or the second substrate 112, the photo-curable sealant 230, the driving circuit 210 and the non-transparent region of second substrate 112 are at least partially overlapped, and the capacitors of the driving circuit 210 and other electrical components (e.g. TFTs) are non-overlapped or partially overlapped. Therefore, when light illuminates towards the display panel 110 from the bottom side of the first substrate 111, the light penetrates the first substrate 111 and the transparent area of the driving circuit 210 (the area without a metal layer in the driving circuit 210) to cure the photo-curable sealant 230. It is noted that, although FIG. 2 illustrates that the photo-curable sealant 230 fully covers the driving circuit 210, the scope of the invention is not limited thereto. In other words, the photo-curable sealant 230 may alternatively partially covers the driving circuit 210. In addition, in a known driving circuit, the electrodes of the capacitors are usually formed of a metal layer, while in the driving circuit 210 of the invention, the electrodes of the capacitors are formed of transparent conductive material, and the capacitor and the TFTs are non-overlapped or partially overlapped in the direction perpendicular to the first substrate 111 or the second substrate 112, such that the percentage of light from the lower side of the display device 110 through the driving circuit 210 increases, ensuring that the photo-curable sealant 230 can be completely cured for prevent external moisture from permeating through the incompletely cured photo-curable sealant 230 and then eroding the driving circuit 210 and/or the components in the display region AA (e.g. the connecting structures of the driving circuit 210 for connecting different metal layers or the pixel electrode layer 114 of the display region AA). In some embodiments, the photo-curable sealant 230 is a UV sealant, and the light used for curing the photo-curable sealant 230 is UV light, such that the photo-curable sealant 230 is cured through illumination by the light. However, aspects of the photo-curable sealant 230 of the invention are not limited thereto.

Figure 3:
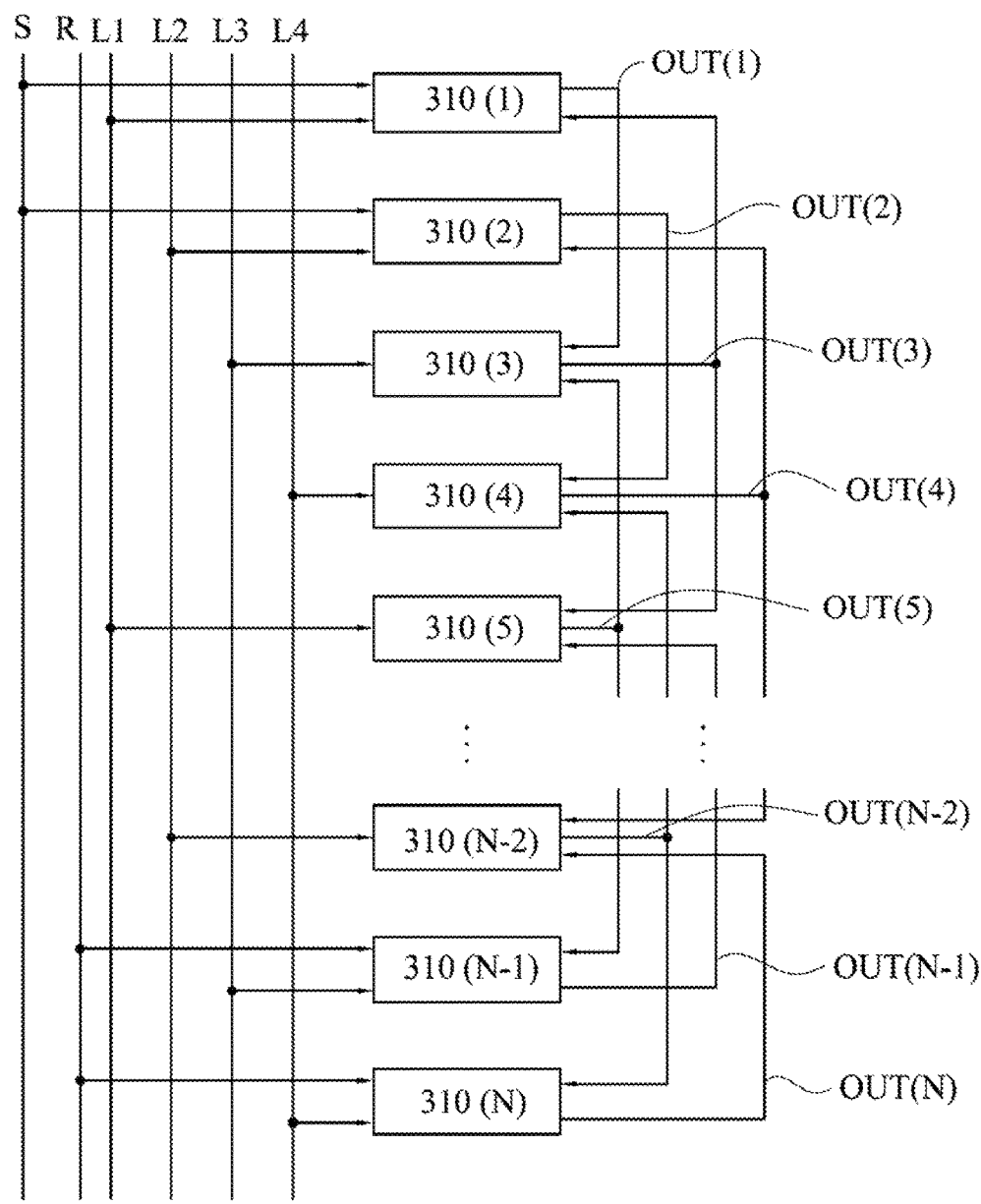
FIG. 3 illustrates a schematic diagram of a gate driving circuit in accordance with some embodiments of the present invention.

Referring to FIG. 3, which illustrates a schematic diagram of a gate driving circuit 300 in accordance with some embodiments of the invention. The gate driving circuit 300 may be applied to the display device 100 of FIG. 1 or other similar display device. In the following, the gate driving circuit 300 applied to the display device 100 of FIG. 1 is exemplified for description. The gate driving circuit 300 is a part of the gate driver 130, and includes clock signal lines L1-L4, a starting signal line S, an ending signal line R and N stage shift register circuits 310(1)-310(N), where N is an integer greater than or equal to 5. In some embodiments, N is a multiple of 4. In FIG. 3, the clock signals lines L1-L4 respectively provide the clock signals C1-C4 to the corresponding shift register circuits 310(1)-310(N). In addition, the starting signal line S is configured to provide a starting signal STV to the $1^{st}$ and $2^{nd}$ stage shift register circuits 310(1) and 310(2), and the ending signal line R is configured to provide an ending signal RSTV to the $(N-1)^{th}$ and $N^{th}$ stage shift register circuits 310(N−1) and 310(N). The shift register circuits 310(1)-310(N) are configured to provide scan signals OUT(1)-OUT(N), respectively. The scan signals OUT(1) and OUT(2) are respectively inputted to the $3^{rd}$ and $4^{th}$ stage shift register circuits 310(3) and 310(4), the scan signals OUT(N−1) and OUT(N) are respectively inputted to the $(N-3)^{th}$ and $(N-2)^{th}$ stage shift register circuit 310(N−3) and 310(N−2), and each of the other scan signals OUT(3)-OUT(N−2) is inputted to the shift registers previous two stage of shift register thereto and next two stage of shift register thereto. For illustration, the scan signal OUT(3) is inputted to the shift register circuits 310(1) and 310(5).

Figure 4:
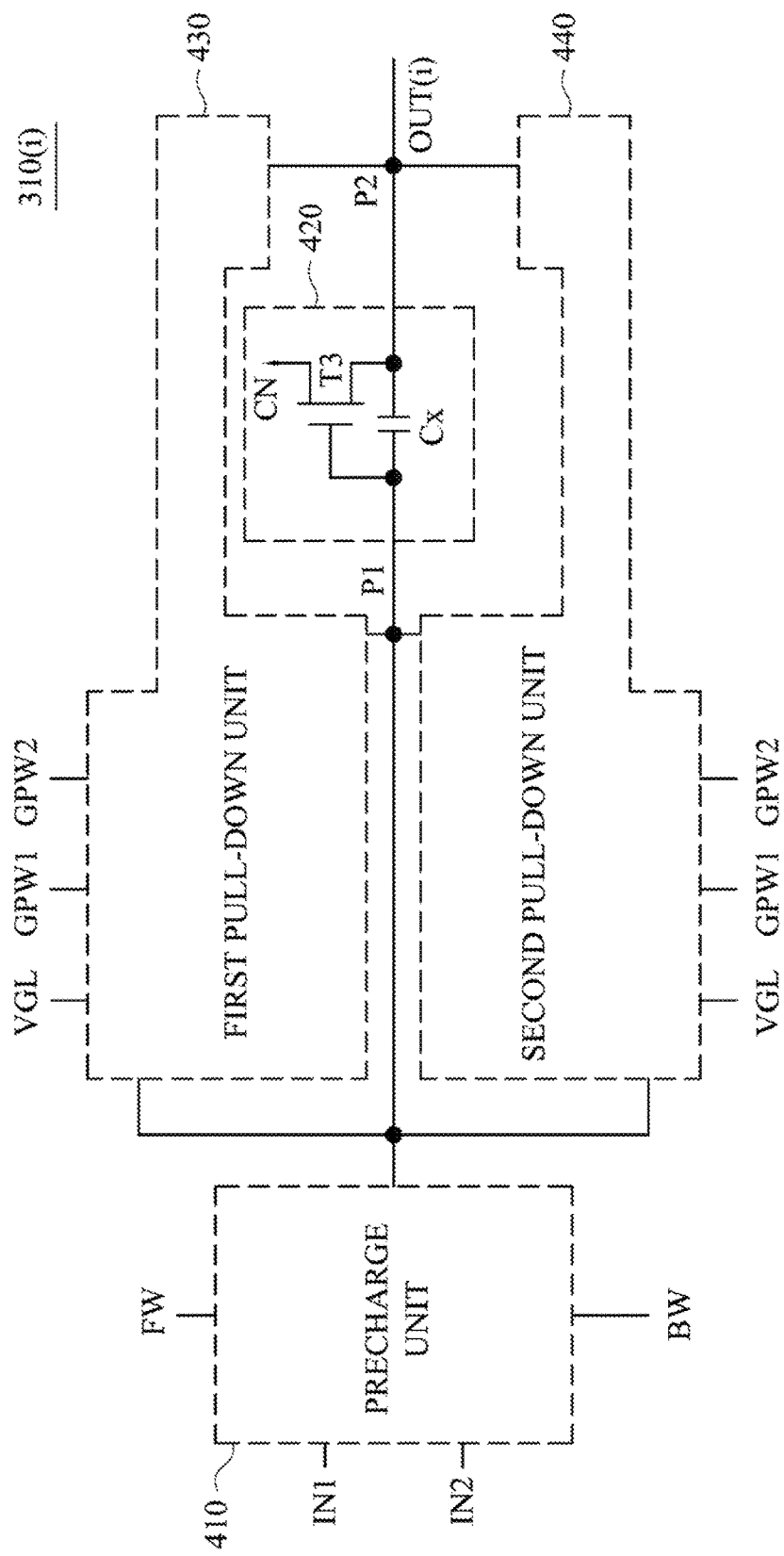
FIG. 4 illustrates an equivalent electrical circuit block diagram of an it stage shift register circuit of the gate driving circuit in FIG. 3.

FIG. 4 illustrates an equivalent circuit block diagram of the $i^{th}$ stage shift register circuit 310(i) of the gate driving circuit 300 in FIG. 3, where i is an integer of 1 to N. The $i^{th}$ stage shift register circuit 310(i) includes a pre-charge unit 410, a pull-up unit 420, a first pull-down unit 430 and a second pull-down unit 440.

The pre-charge unit 410 receives input signals IN1, IN2, and outputs a pre-charge signal at a node P1 based on the input signals IN1, IN2. Moreover, the pre-charge unit 410 further receives a forward input signal FW and a backward input signal BW, such that the gate driving circuit 300 drives the pixels of the display region AA row by row in a forward or backward scanning sequence based on the forward input signal FW and the backward input signal BW.

If the shift register circuit 310(i) is the $1^{st}$ or $2^{nd}$ stage shift register circuit (i.e. i is 1 or 2), the input signal IN1 is a starting signal STV, and the input signal IN2 is the scan signal OUT(i+2) outputted by the $(i+2)^{th}$ stage shift register circuit 310(i+2). If the shift register circuit 310(i) is the $3^{rd}$ to $(N-2)^{th}$ stage shift register circuit (i.e. i is an integer of 3 to (N−2)), the input signal IN1 is the scan signal OUT(i−2) outputted by the $(i-2)^{th}$ stage shift register circuit 310(i−2), and the input signal IN2 is the scan signal OUT(i+2) outputted by the $(i+2)^{th}$ stage shift register circuit 310(i+2). If the shift register circuit 310(i) is the $(N-1)^{th}$ or $N^{th}$ stage shift register circuit (i.e. i is (N−1) or N), the input signal IN1 is the scan signal OUT(i−2) outputted by the $(i-2)^{th}$ stage shift register circuit 310(i−2), and the input signal IN2 is the ending signal RSTV.

The pull-up unit 420 is coupled to the pre-charge unit 410, and is configured to receive the pre-charge signal and a clock signal CN and to output the scan signal OUT(i) via a node P2 based on the pre-charge signal and the clock signal CN which is one of the clock signals C1-C4. The pull-up unit 420 includes a transistor T3 and a capacitor Cx. The gate of the transistor T3 is configured to receive the pre-charge signal, the drain of the transistor T3 is configured to receive the clock signal CN, and the source of the transistor T3 is configured to output the scan signal OUT(i). The first terminal of the capacitor Cx is coupled to the gate of the transistor T3, and the second terminal of the capacitor Cx is coupled to the source of the transistor T3.

The first pull-down unit 430 is coupled to the pre-charge unit 410 and the pull-up unit 420, and is configured to receive the pre-charge signal and pull-down control signals GPW1 and GPW2 and control whether to pull down the scan signal OUT(i) to a reference voltage level VGL based on the pre-charge signal and the pull-down control signals GPW1 and GPW2. After the first pull-down unit 430 pulls down the scan signal OUT(i) to the reference voltage level VGL, the first pull-down unit 430 keeps the scan signal OUT(i) at the reference voltage level VGL.

The second pull-down unit 440 is coupled to the pre-charge unit 410 and the pull-up unit 420, and is configured to receive the pre-charge signal and pull-down control signals GPW1 and GPW2 and control whether to pull down the scan signal OUT(i) to the reference voltage level VGL based on the pre-charge signal and the pull-down control signals GPW1 and GPW2. After the second pull-down unit 440 pulls down the scan signal OUT(i) to the reference voltage level VGL, the second pull-down unit 440 keeps the scan signal OUT(i) at the reference voltage level VGL.

Figure 5A:
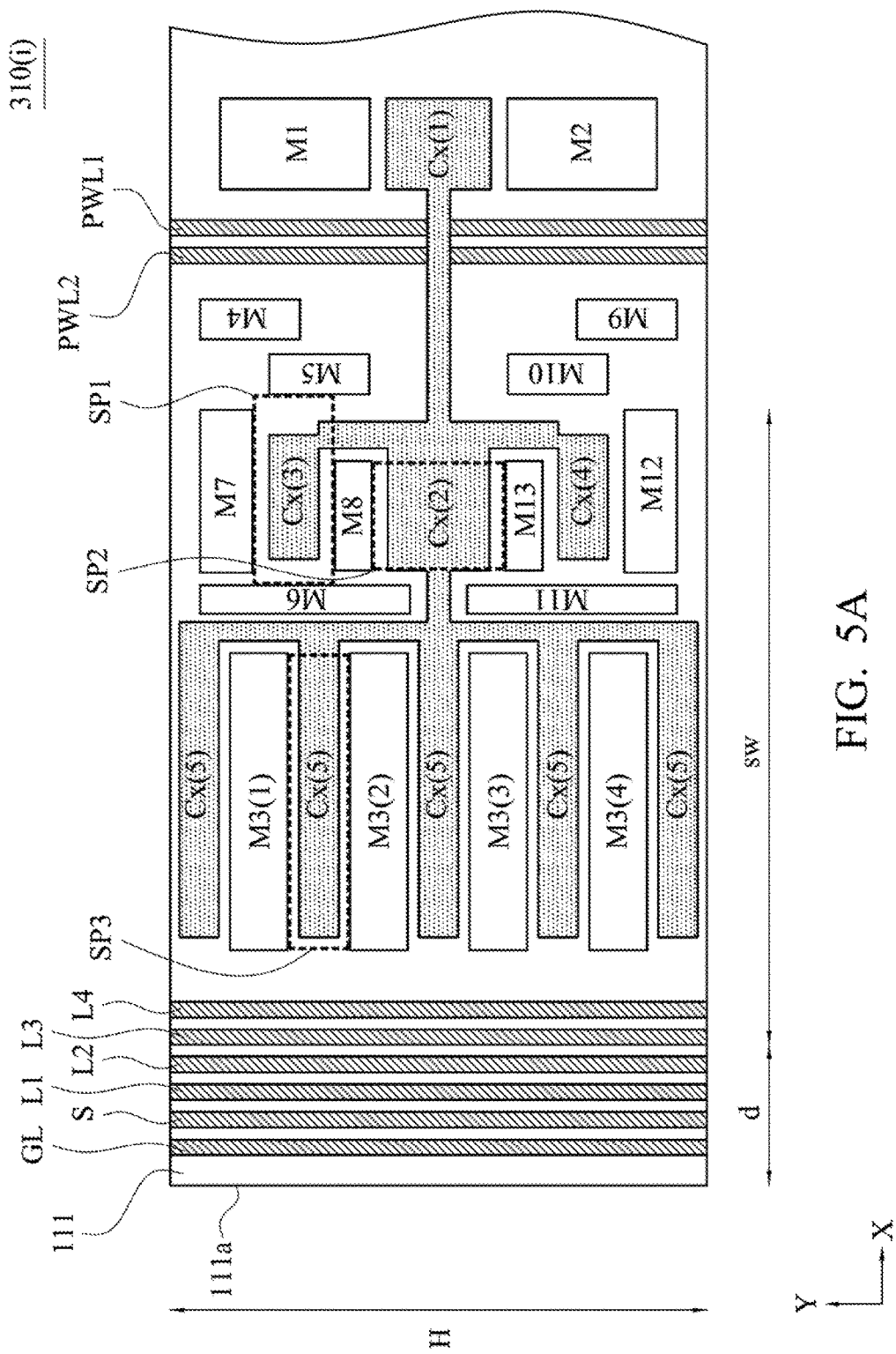
FIGS. 5A and 5B illustrate a layout diagram of the $i^{th}$ stage shift register circuit in FIG. 4.
Figure 5B:
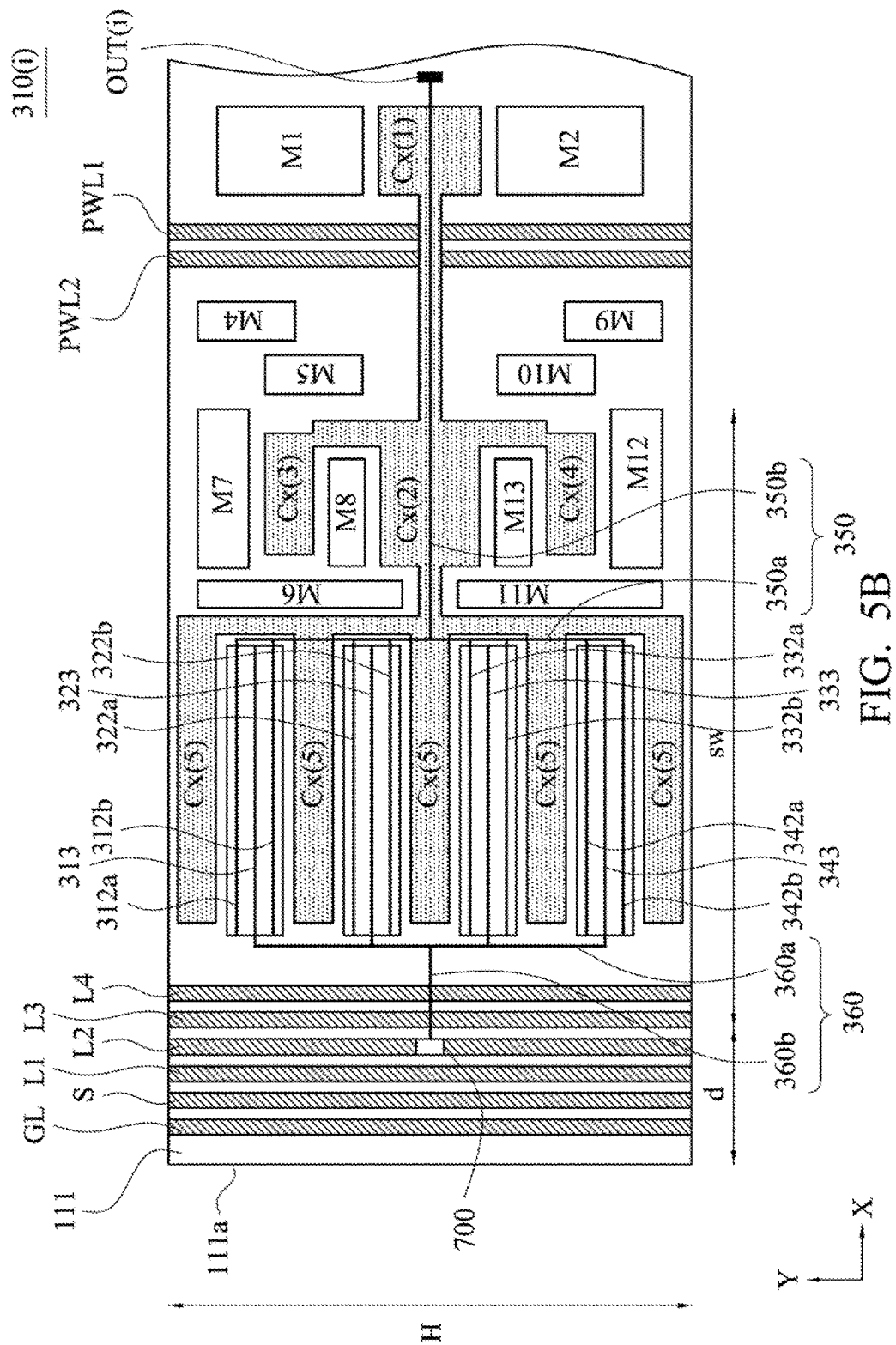
Figure 6:
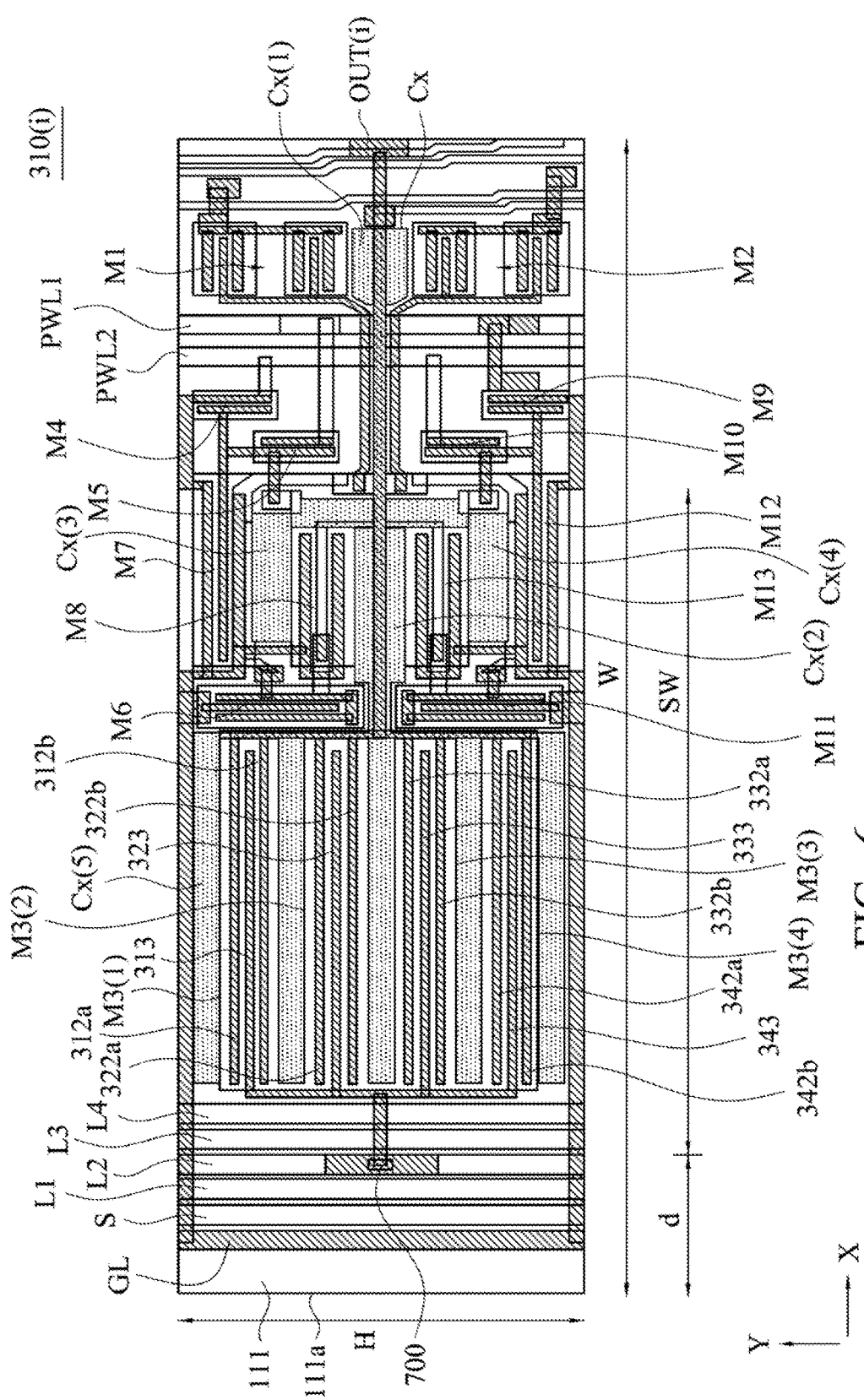
FIG. 6 illustrates a layout diagram of the $i^{th}$ stage shift register circuit in FIG. 4.

Subsequently, referring to FIGS. 5A, 5B and 6, in which FIGS. 5A and 5B illustrate a layout diagram of the $i^{th}$ stage shift register circuit 310(i) in FIG. 4, and FIG. 6 illustrates a layout diagram of the $i^{th}$ stage shift register circuit 310(i) in FIG. 4. The difference between FIGS. 5A and 5B is that FIG. 5B further illustrates a layout diagram of the source/drain of the transistor T3 and connecting lines which is electrically connected to the source/drain. In FIGS. 5A, 5B and 6, the grounding line GL (which is configured to provide the reference voltage level VGL), the starting signal line S and the clock signal lines L1-L4 are located near the side 111a of the first substrate 111 and extend along a first direction (i.e. the direction of the Y axis in this embodiment), and the output terminal of the $i^{th}$ stage the shift register circuit 310(i) which outputs the scan signal OUT(i) is located near the display region AA.

In this embodiment, the pre-charge unit 410 includes the TFTs M1 and M2, the pull-up unit 420 includes the TFTs M3(1)-M3(4) and the capacitor Cx, the first pull-down unit 430 includes the TFTs M4-M8, and the second pull-down unit 440 includes the TFTs M9-M13. The TFTs M1, M2, M3(1)-M3(4) and M4-M13 may be amorphous silicon TFTs, low-temperature polysilicon (LTPS) TFTs or indium gallium zinc oxide (IGZO) TFTs, but are not limited thereto. In addition, the first electrode and the second electrode of the capacitor Cx are formed of transparent conductive material, such that light can penetrate through the capacitor Cx for curing the photo-curable sealant overlapped to the region of the capacitor Cx. The TFTs M1-M13 and the capacitor Cx are located between the clock signal lines L1-L4 and the display region AA. In addition, the control signal lines PWL1 and PWL2 (which are respectively configured to output pull-down control signals GPW1 and GPW2) are located between the TFTs M4 and M9 and between the TFTs M1 and M2.

The capacitor Cx includes sub-capacitors Cx(1)-Cx(5) coupled to each other. The sub-capacitor Cx(1) is located between the adjacent TFTs M1 and M2, the sub-capacitor Cx(2) is located between the adjacent TFTs M8 and M13, the sub-capacitor Cx(3) is located in the space defined by the TFTs M5-M8, the sub-capacitor Cx(4) is located in the space defined by the TFTs M10-M13, and the sub-capacitor Cx(5) is located between the TFT M3(1) and the upper side of the layout region of the shift register circuit 310(i), between the adjacent TFTs M3(1) and M3(2), between the adjacent TFTs M3(2) and M3(3), between the adjacent TFTs M3(3) and M3(4) and between the TFT M3(4) and the lower side of the layout region of the shift register circuit 310(i).

Because the source of the TFT T3 outputs the scan signal OUT(i), the TFT T3 is the TFT with the largest channel width compared to the other TFTs of the shift register circuit 310(i) in FIG. 4. For illustration, in some embodiments, the channel length of the TFT T3 is 3.5 micrometers, and the channel width is 4200 micrometers. However, the channel length and the channel width of the TFT T3 of the invention are not limited thereto. The channel width of the TFT T3 is extremely large, such that the layout of the TFT T3 occupies very large area. Therefore, the TFTs M3(1)-M3(4) are connected in parallel to form the TFT T3 (i.e., the gates of the TFTs M3(1)-M3(4) are electrically connected, the sources of the TFTs M3(1)-M3(4) are electrically connected, and the drains of the TFTs M3(1)-M3(4) are electrically connected), in order to reduce the layout area of the TFT T3. It is noted that, in the invention, the number of TFTs connected in parallel to form the TFT T3 is not limited to four; one ordinary skill in the art may adjust the number of TFTs forming the TFT T3 in accordance with the channel width of the TFT T3 and the layout height and the layout width of the shift register circuit 310(i).

In some embodiments, as shown in FIGS. 5B and 6, the sources 312a, 312b, 322a, 322b, 332a, 332b, 342a and 342b and the drains 313, 323, 333 and 343 of the TFTs M3(1)-M3(4) extend along a second direction. In this embodiment, the first direction is the direction of the Y axis, and the second direction is the direction of the X axis. That is, the extending direction of the clock signal lines L1-L4 is perpendicular to the extending direction of the sources 312a, 312b, 322a, 322b, 332a, 332b, 342a and 342b and the drains 313, 323, 333 and 343 of the TFTs M3(1)-M3(4).

The drains 313, 323, 333 and 343 of the TFTs M3(1)-M3(4) are coupled with each other through a first portion 360a of a second connecting line 360. A second portion 360b of the second connecting line 360 extends towards the side 111a of the first substrate 111 for being electrically connected to one of the clock signal lines L1-L4 by the connecting structure 700. The sources 312a, 312b, 322a, 322b, 332a, 332b, 342a and 342b of the TFTs M3(1)-M3(4) are coupled with each other through a first portion 350a of a first connecting line 350. A second portion 350b of the first connecting line 350 extends towards the display region AA of the first substrate 111 and to the node P2.

As shown in FIGS. 5A, 5B and 6, the layout height of the $i^{th}$ stage shift register circuit 310(i) in the direction of the Y axis and the layout width of the $i^{th}$ stage shift register circuit 310(i) in the direction of the X axis are H and W, respectively. The shift register circuits 310(1)-310(N) respectively correspond to the rows of pixels in the display region AA, and thus the layout height H of the $i^{th}$ stage shift register circuit 310(i) in a preferred embodiment is the height of the corresponding row of pixels in the direction of the Y axis. In the embodiments of the display panel having shift register circuits respectively located at left and right sides thereof, the shift register circuits at one side of the display panel respectively correspond to odd rows of pixels in the display region AA, and the shift register circuits at the other side of the display panel respectively correspond to the even rows of pixels in the display region AA, and the layout height H of the $i^{th}$ stage shift register circuit 310(i) may be the height of two adjacent rows of pixels in the direction of the Y axis. It should be noted that, the layout height H of the shift register circuit 310(i) of the invention is not limited to the aforementioned example, and thus a person of ordinary skilled in the art may modify the layout height H of the shift register circuit 310(i) in accordance with various display panel design requirements. In addition, the shift register circuit 310(i) is located in the non-display region PA, and therefore, the layout width W of the shift register circuit 310(i) in the X direction may be reduced in accordance with a narrow border design requirement.

It is noted that, in the embodiments of FIGS. 5A, 5B and 6, the first direction is perpendicular to the second direction, but the scope of the invention is not limited thereto. In some preferred embodiments, the angle between the extending direction (i.e. the first direction) of the clock signal lines L1-L4 and the extending direction (i.e. the second direction) of the sources and drains of the TFTs M3(1)-M3(4) is preferably between 80° and 100°. However, compared to the case where the angle between the first direction and the second direction is between 80° and 100°, if the angle between the extending direction of the clock signal lines L1-L4 and the extending direction of the sources and drains of the TFTs M3(1)-M3(4) is smaller than 80° or larger than 100°, the number of TFTs connected in parallel to form the TFT T3 and disposed in a given layout height H in the Y direction of the shift register circuit 310(i) becomes fewer for each shift register circuit 310(i), and the extending lengths of the sources and drain of each TFT have to be longer in order that the total channel width of the TFTs connected in parallel is identical to the channel width of the TFT T3. As such, the layout width W of the shift register circuit 310(i) in the direction of the X axis correspondingly increases, resulting in failing to meet a narrow border requirement. For example, if the channel width of the transistor T3 is 4200 micrometers, when the extending direction of the sources and drains of the TFT T3 is arranged to be perpendicular to the extending direction of the clock signal lines L1-L4 (the angle between the first direction and the second direction is 90°) shown in FIGS. 5A, 5B and 6, the layout height H in the Y direction M3(1)-M3(4) may accommodate 4 TFTs for each shift register circuit 310(i), and the sources and drain of each of the TFTs M3(1)-M3(4) are respectively about 525 micrometers. However, if the extending direction (i.e. the second direction) of the sources and drains of the TFT T3 is at an angle of smaller than 80° or larger than 100° relative to the extending direction (i.e. the first direction) of the clock signal lines L1-L4, the layout height H of the shift register circuit 310(i) in the Y direction could accommodate only 3 TFTs, and the lengths of the sources and drain of each TFT should be increased to about 700 micrometers, respectively, in order that the total channel width of the TFTs connected in parallel is identical to the channel width of the TFT T3. As such, the layout width W of the shift register circuit 310(i) in the X direction is increased, resulting in failing to meet a narrow border requirement. As can be seen from above, the angle between the extending direction of the clock signal lines L1-L4 and the extending direction of the sources and drains of the TFTs M3(1)-M3(4) is preferably between 80° and 100°; that is, the angle between the first direction and the second direction is between 80° and 100°.

As shown in FIGS. 5A, 5B and 6, in the direction perpendicular to the first substrate 111, the capacitor Cx (including the sub-capacitor Cx(1)-Cx(5)) and the TFTs M1-M13 are non-overlapped, and a partial structure of the capacitor Cx is arranged in a space defined by multiple TFTs (e.g. the space defined by the TFTs M5-M8 or the space defined by the TFTs M10-M13) or in a space between two adjacent TFTs (i.e. the gap between adjacent TFTs, such as the gap between the adjacent TFTs M8 and M13 or the gap between the adjacent TFTs M3(1) and M3(2), between the adjacent TFTs M3(2) and M3(3) or between the adjacent TFTs M3(3) and M3(4)), and there are no TFTs arranged in such spaces, in order to avoid blocking light from penetrating through the capacitor Cx formed of transparent conductive material. For illustration, as shown in FIG. 5A, a rectangular space SP1 is surrounded by the TFTs M5-M8, a space SP2 is formed between the adjacent TFTs M8 and M13, and a space SP3 is formed between the adjacent TFTs M3(1) and M3(2). By arranging the capacitor formed from the transparent conductive layer in a space defined by multiple TFTs and/or a space defined by two adjacent TFTs, the layout area of the shift register circuit 310(i) can be reduced, and the light transmittance can be improved. The area of the capacitor Cx can be increased by utilizing the layout design shown in FIGS. 5A-5B and 6. In addition, the curing effect of the photo-curable sealant 230 can be improved because the electrodes of the capacitor Cx are formed of transparent conductive material. That is, when light illuminates from the lower side of the display device 100, the percentage of light penetrating through the driving circuit 210 can be increased, so as to ensure that the photo-curable sealant 230 can be completely cured for prevent external moisture from permeating through the incompletely cured photo-curable sealant 230 and then eroding the driving circuit 210 and/or the components in the display region AA. Moreover, the capacitance of the capacitor Cx can also be increased by utilizing the layout design shown in FIGS. 5A-5B and 6.

In addition, as shown in FIGS. 5A-5B and 6, the coating area of the photo-curable sealant 230 includes a coating area width SW, the clock signal lines L3 and L4, the TFTs M3(1)-M3(4), M6-M8 and M11-M13 and the sub-capacitors Cx(2)-Cx(5) are located in the coating area of the photo-curable sealant 230, i.e., the clock signal lines L3 and L4, the TFTs M3(1)-M3(4), M6-M8 and M11-M13 and the sub-capacitors Cx(2)-Cx(5) are all overlapped by the photo-curable sealant 230 in the direction perpendicular to the first substrate 111 or the second substrate 112, in order to block moisture by the cured photo-curable sealant 230 from eroding the electrical component in the shift register circuit 310(i) or in the area surrounded by the photo-curable sealant 230, etc. It should be noted that the range of the coating area of the photo-curable sealant 230 is not limited to that illustratively shown in FIGS. 5A-5B and 6. A gap d exists between the photo-curable sealant 230 and a side 110a of the display panel 110, in order to avoid that the photo-curable sealant 230 spills over the display panel 110 due to a process error during coating. For illustration, the gap d can be 100 micrometers, but is not limited thereto. Those skilled in the art may adjust the gap d from the photo-curable sealant 230 to the side 111a of the first substrate 111 in accordance with panel design requirements and process capability. In addition, the coating area width SW of the photo-curable sealant 230 would affect the capability of blocking moisture from entering the display panel; the moisture blocking ability is better as the coating area width SW is wider. The coating area width SW of the photo-curable sealant 230 may be adjusted in accordance with the material of the photo-curable sealant 230 because photo-curable sealants with various types of materials have various moisture blocking abilities. In some embodiments, the coating area width SW of the photo-curable sealant 230 may be between 400 micrometers and 600 micrometers, and is preferably 500 micrometers.

Figure 7:
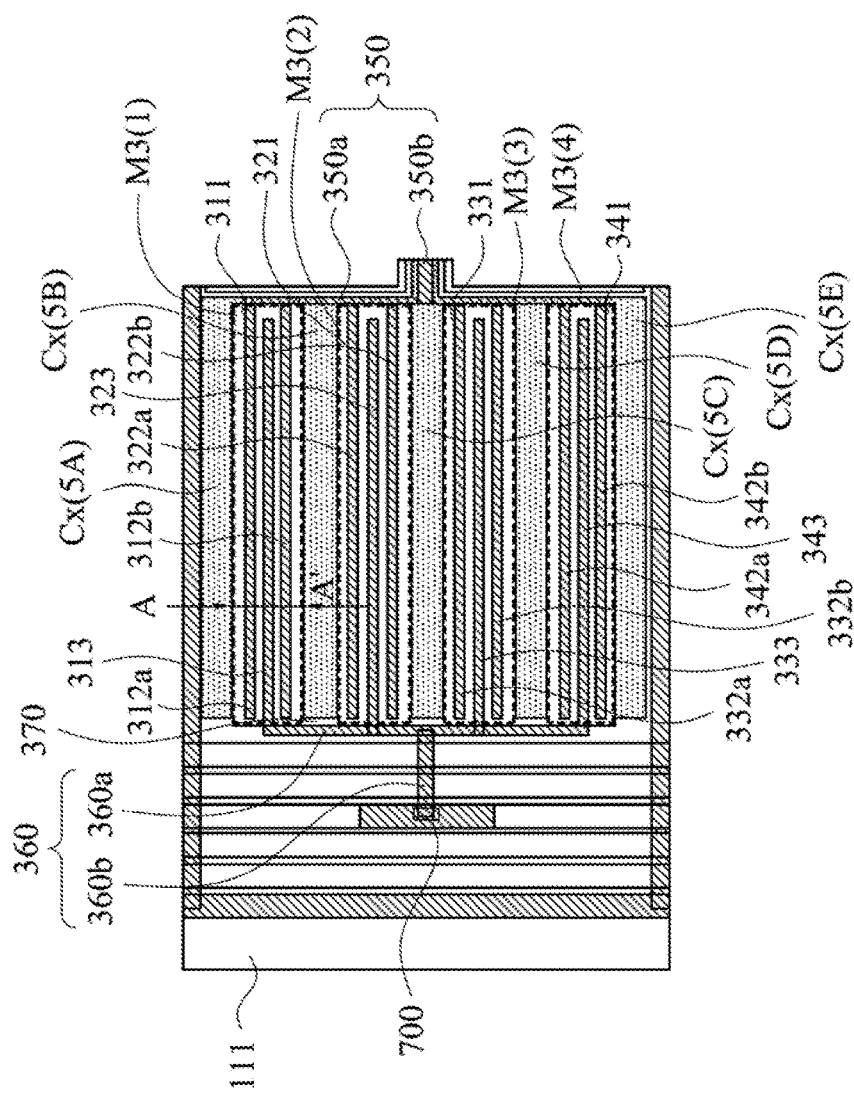
FIG. 7 illustrates a local enlarged view of the $i^{th}$ stage shift register circuit in FIG. 6.

Also referring to FIGS. 5B, 6 and 7, in which FIG. 7 is a local enlarged view of the TFTs M3(1)-M3(4), the clock signal lines L1-L4 and the capacitor Cx in FIG. 6. The TFTs M3(1)-M3(4) include the gates 311, 321, 331 and 341, the sources 312a, 312b, 322a, 322b, 332a, 332b, 342a and 342b and the drains 313, 323, 333 and 343, respectively. The TFTs M3(1)-M3(4) are electrically connected in parallel and are arranged in sequence along the first direction, in which the sources 312a, 312b, 322a, 322b, 332a, 332b, 342a and 342b of the TFTs M3(1)-M3(4) are coupled with each other through the first portion 350a of the first connecting line 350, the drains 313, 323, 333 and 343 of the TFTs M3(1)-M3(4) are coupled with each other through the first portion 360a of the second connecting line 360, and the gates 311, 321, 331 and 341 of the TFTs M3(1)-M3(4) are coupled with each other by a connecting portion 370. The gates 311, 321, 331 and 341 of the TFTs M3(1)-M3(4) are coupled to the node P1, while the sources 312a, 312b, 322a, 322b, 332a, 332b, 342a and 342b of the TFTs M3(1)-M3(4) are coupled to the node P2, in which the nodes P1, P2 respectively correspond to the two electrodes of the capacitor Cx. The drains 313, 323, 333 and 343 of the TFTs M3(1)-M3(4) are coupled to one of the clock signal lines L1-L4 (in FIGS. 5B-7, the drains 313, 323, 333 and 343 are coupled to the clock signal line L2 for illustration) to receive the clock signal CN. In addition, the sub-capacitor Cx(5) is composed of capacitor branches Cx(5A)-Cx(5E) which are coupled to each other. The capacitor branch Cx(5A) is located between the TFT M3(1) and the upper boundary of the layout block of the shift register circuit 310(i), the capacitor branch Cx(5B) is located between the TFTs M3(1) and M3(2), the capacitor branch Cx(5C) is located between the TFTs M3(2) and M3(3), the capacitor branch Cx(5D) is located between the TFTs M3(3) and M3(4), and the capacitor branch Cx(5E) is located between the TFT M3(4) and the lower boundary of the layout block of the shift register circuit 310(i).

In this embodiment, the TFT M3(1) includes the gate 311, the sources 312a and 312b and the drain 313, where the drain 313 is located between the sources 312a and 312b. The TFT M3(1) is equivalent to the TFT with the source 312a and the drain 313 connected to the TFT with the source 312b and the drain 313 in parallel, and the gate 311 and the drain 313 are arranged for common use, thereby saving the layout area of the TFT M3(1). Similarly, the drains 323, 333 and 343 of the TFTs M3(2)-M3(4) are located between the sources 322a and 322b, between the sources 332a and 332b and between the sources 342a and 342b, respectively, and the layouts of the TFTs M3(2)-M3(4) are similar to that of the TFT M3(1) and thus are not repeated herein.

Figure 8:
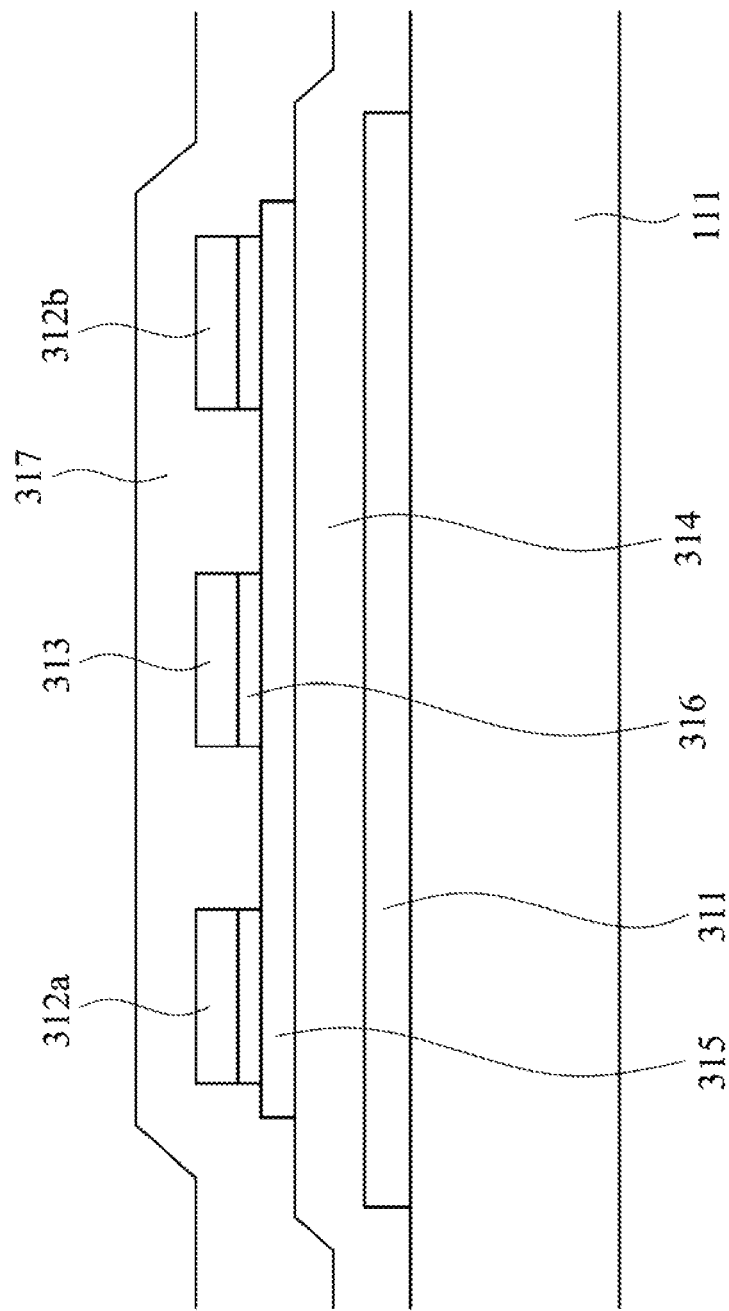
FIG. 8 illustrates a cross sectional view along the A-A' line in FIG. 7.

Referring to FIGS. 7 and 8, in which FIG. 8 is a cross sectional view along the A-A' line of the TFT M3(1) in FIG. 7. As shown in FIG. 8, the gate 311, a gate insulating layer 314, a semiconductor layer 315 and an ohmic contact layer 316 are sequentially formed on the first substrate 111, and the sources 312a/312b and the drain 313 are formed on the ohmic contact layer 316, in which the sources 312a and 312b are respective located at two relative sides of the drain 313. A protective layer 317 is formed covering the semiconductor layer 315, the sources 312a/312b and the drain 313. The cross-sectional structures of the TFTs M3(2)-M3(4) are similar to that of the TFT M3(1), and are not repeated herein.

Similarly, the layouts of the TFTs M1, M2 and M4-M13 may be that the two sources are respectively arranged at two opposite sides of the drain on a gate, in order to save the layout area. In addition, although the layout of the TFT in the abovementioned embodiment is that the two sources are respectively arranged at two opposite sides of the drain on a gate, it may be changed to the that (N+1) sources and N drains are arranged on a gate for another embodiment, where N is an integer greater than or equal to 2 and the each of the N drains is arranged between adjacent two of the (N+1) sources for further reducing the layout area.

In this embodiment, the clock signal lines L1-L4, the gates 311, 321, 331, 341 of the TFTs M3(1)-M3(4) and the connecting portion 370 are formed from a first metal layer, and the sources 312a, 312b, 322a, 322b, 332a, 332b, 342a and 342b and the drains 313, 323, 333 and 343 of the TFTs M3(1)-M3(4), the first connecting line 350 and the second connecting line 360 are formed from a second metal layer. As shown in FIGS. 5B and 7, the drains 313, 323, 333 and 343 of the TFTs M3(1)-M3(4) are coupled to one of the clock signal lines L1-L4 through the second connecting line 360, the clock signal lines L1-L4 and the second connecting line 360 respectively belong to the first metal layer and the second metal layer, and the clock signal lines L1-L4 and the second connecting line 360 are electrically connected by the connecting structure 700.

In the prior art, a capacitor is usually inserted in a shift register circuit in random, and thus some areas of the photo-curable sealant 230 are illuminated by more light and the other areas of the photo-curable sealant 230 are illuminated by less light or even no light, possibly resulting in a local curing condition of the photo-curable sealant 230. In the invention, the capacitor is inserted between the TFTs M3(1)-M3(4), i.e., the capacitor branch Cx(5B) is arranged between the TFTs M3(1) and M3(2), the capacitor branch Cx(5C) is arranged between the TFTs M3(2) and M3(3), and the capacitor branch Cx(5D) is arranged between the TFTs M3(3) and M3(4), such that light can penetrate through the driving circuit 210 to illuminate the photo-curable sealant 230 in uniform and to completely cure the photo-curable sealant 230. In addition, in the embodiments of in FIGS. 5A-7, the TFTs M3(1) and M3(4) are respectively spaced from the upper boundary and the lower boundary of the shift register circuit 310(i), and thus the capacitor branches Cx(5A) and Cx(5E) can be respectively arranged in these spaces for further increasing the light transmittance of the driving circuit 210.

It is noted that, the layouts in FIGS. 5A-7 are merely for illustration, but are not intended to limit the scope of the invention. For illustration, the coating area of the photo-curable sealant 230 may be adjusted to cover the TFTs M3(1)-M3(4) and M4-M13 or even to completely cover the layout area of the shift register circuit 310(i). In addition, the TFT T3 may be adjusted to be composed of only two TFTs connected in parallel, but the number of TFTs for composing the TFT T3 is not limited in the invention. Moreover, the layout of the capacitors can also be correspondingly adjusted in accordance with the layout arrangement of the TFTs M1-M13.

In addition, for the equivalent circuit block diagram shown in FIG. 4, the number of TFTs in the pre-charge unit 410/the first pull-down unit 430/the second pull-down unit 440 and the electrical circuit of the pull-up unit 420 are merely for exemplary illustration rather than for limiting the scope of the invention. For example, the circuit block diagram shown in FIG. 4 may be modified to have only one pull-down unit or to be without the backward input signal BW, and the number of TFTs of the pre-charge unit 410/the first pull-down unit 430/the second pull-down unit 440, or the circuit of the pull-up unit 420 may be modified according to different shift register circuits.

Figure 9:
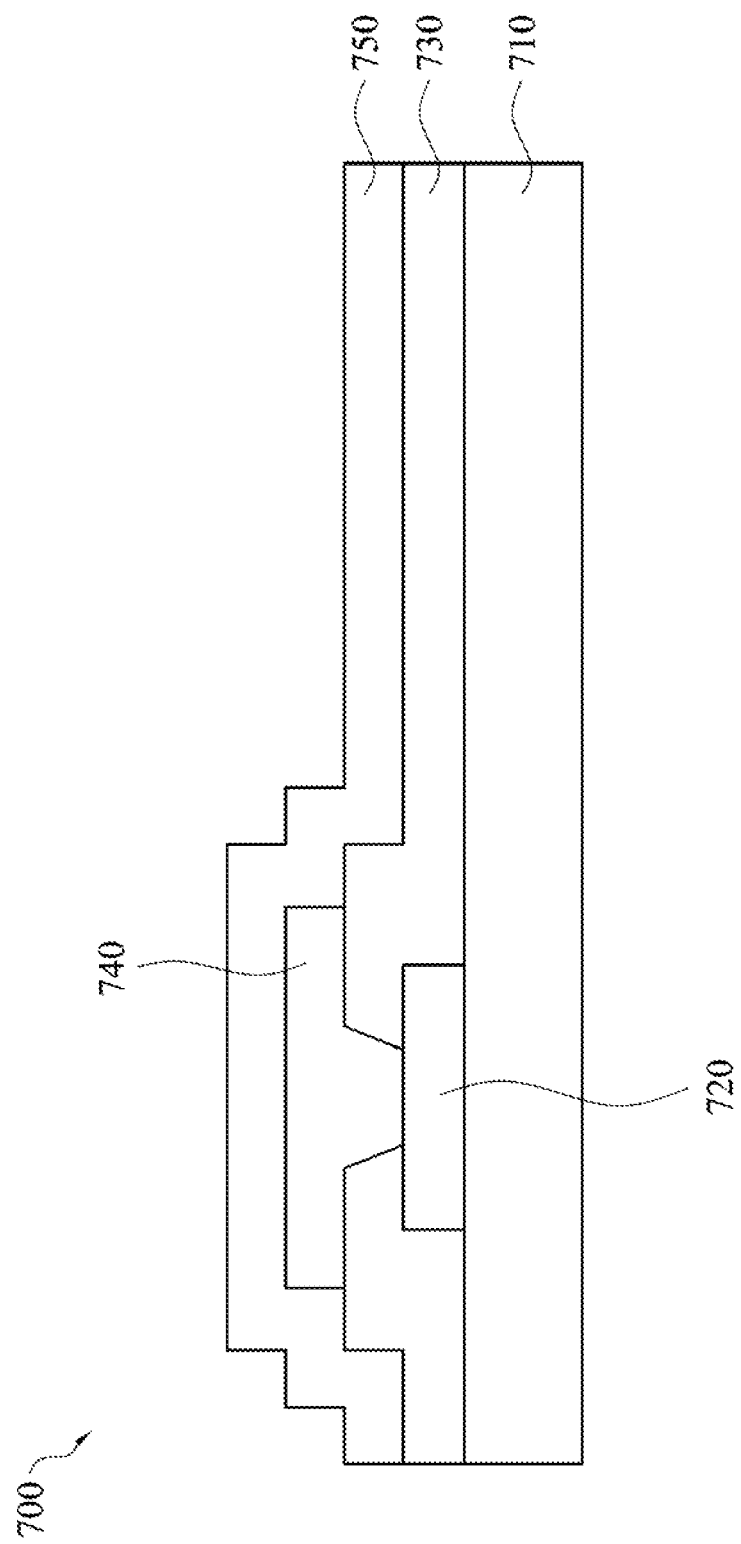
FIG. 9 illustrates a cross sectional diagram of the connecting structure FIG. 6.

Please refer to FIG. 9, FIG. 9 illustrates a cross sectional diagram of the connecting structure 700. The connecting structure 700 is formed to connect different metal layers of the shift register circuit, and can be, for example, a contacting point of the clock signal line L1 and the $1^{st}$ stage shift register circuit 310(1) or a contacting point of the clock signal line L2 and the $2^{nd}$ stage shift register circuit 310(2) shown in FIG. 3, or a contacting point of the source/drain of one TFT and the gate of another TFT shown in FIG. 6. As shown in FIG. 9, a first metal layer 720 is formed on a substrate 710, and then a gate insulating layer 730 is deposited on the substrate 710 and the first metal layer 720. Subsequently, a through-hole is formed in the gate insulating layer 730, and then a second metal layer 740 is formed on the gate insulating layer 730, and the second metal layer 740 directly contacts with the first metal layer via the through-hole. Finally, a passivation layer 750 is formed on the gate insulating layer 730 and the second metal layer 740.

In FIG. 9, the substrate 710 corresponds to the first substrate 111 in FIGS. 5A-8, and the first metal layer 720 and the second metal layer 740 may be formed by the same process as that for forming the gate and source/drain of the TFTs M1-M13 in FIGS. 5A-8 respectively. The second metal layer 740 is covered by the passivation layer 750 for protection from being exposed, and thus the connecting structure 700 can be prevented from being eroded by external moisture. For illustration, as shown in FIGS. 5B and 6, the contacting points electrically contacting the clock signal lines L1-L4 and the second connecting line 360 are very close to side 111a of the first substrate 111, and therefore external moisture would easily move to the connecting points. By forming the connecting structure 700 at the connecting points, the connecting structure 700 can be prevented from being eroded by external moisture.

Figure 10A:
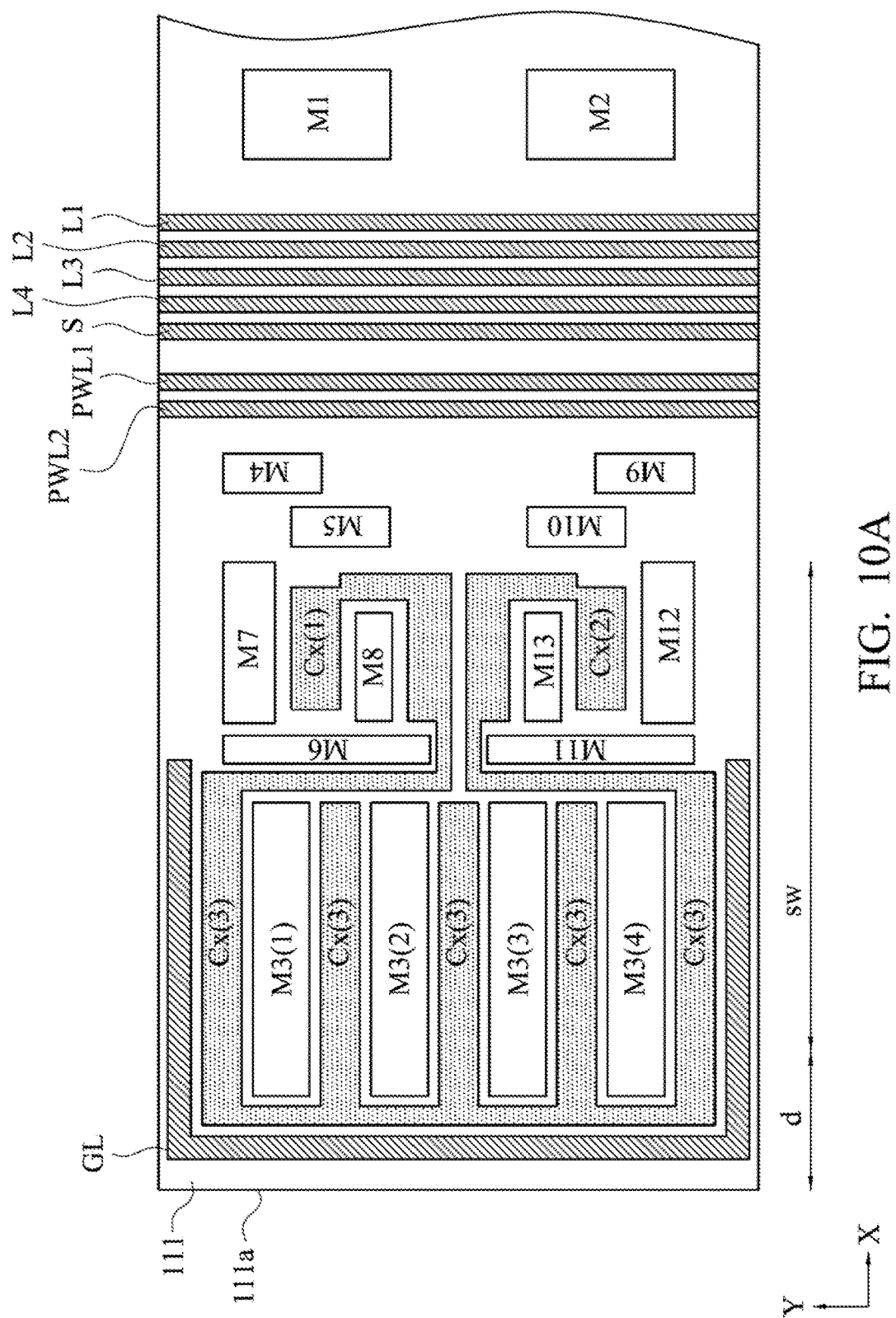
FIGS. 10A and 10B illustrate another layout diagram of the $i^{th}$ stage shift register circuit in FIG. 4.
Figure 10B:
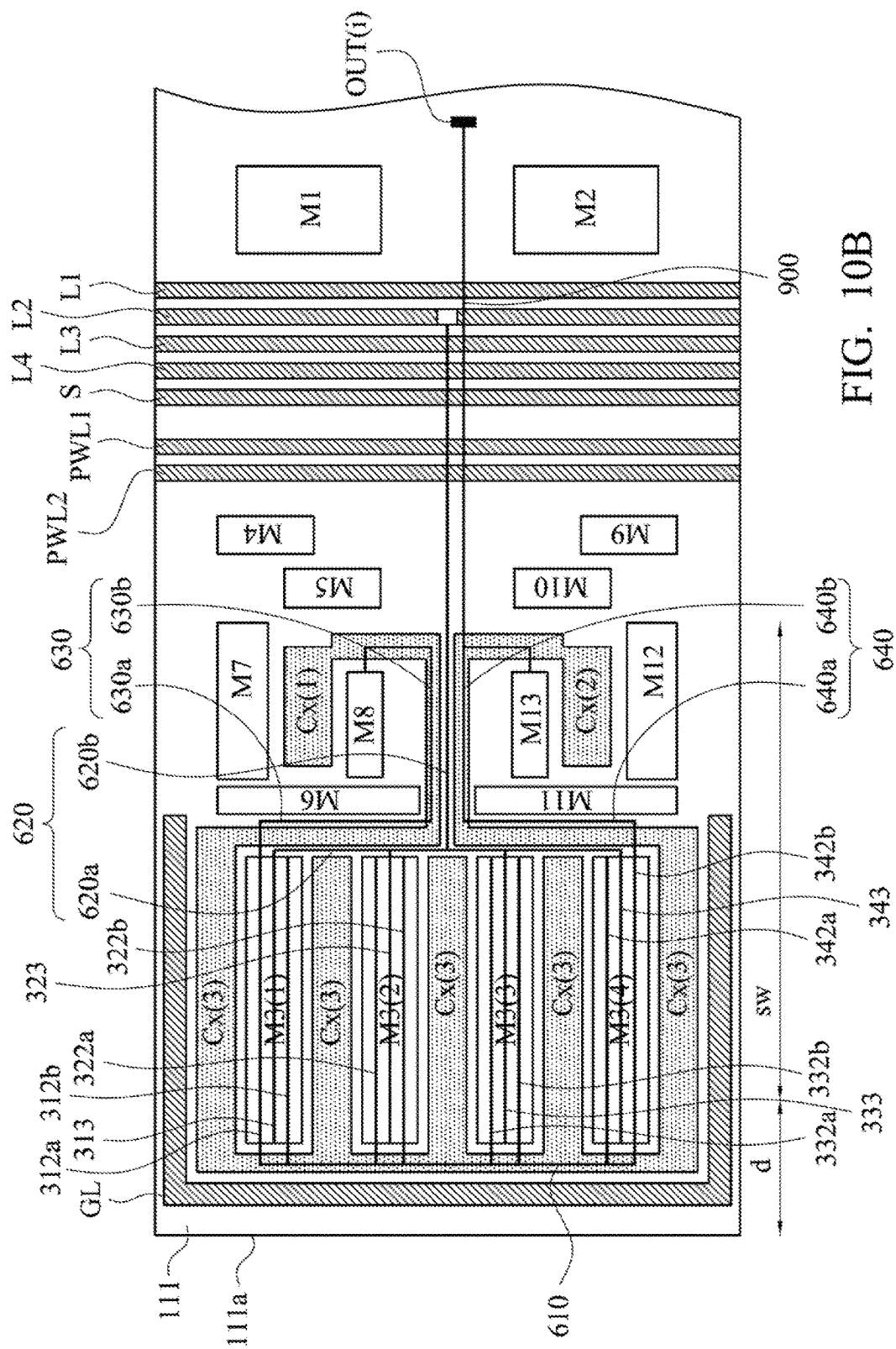
Figure 11:
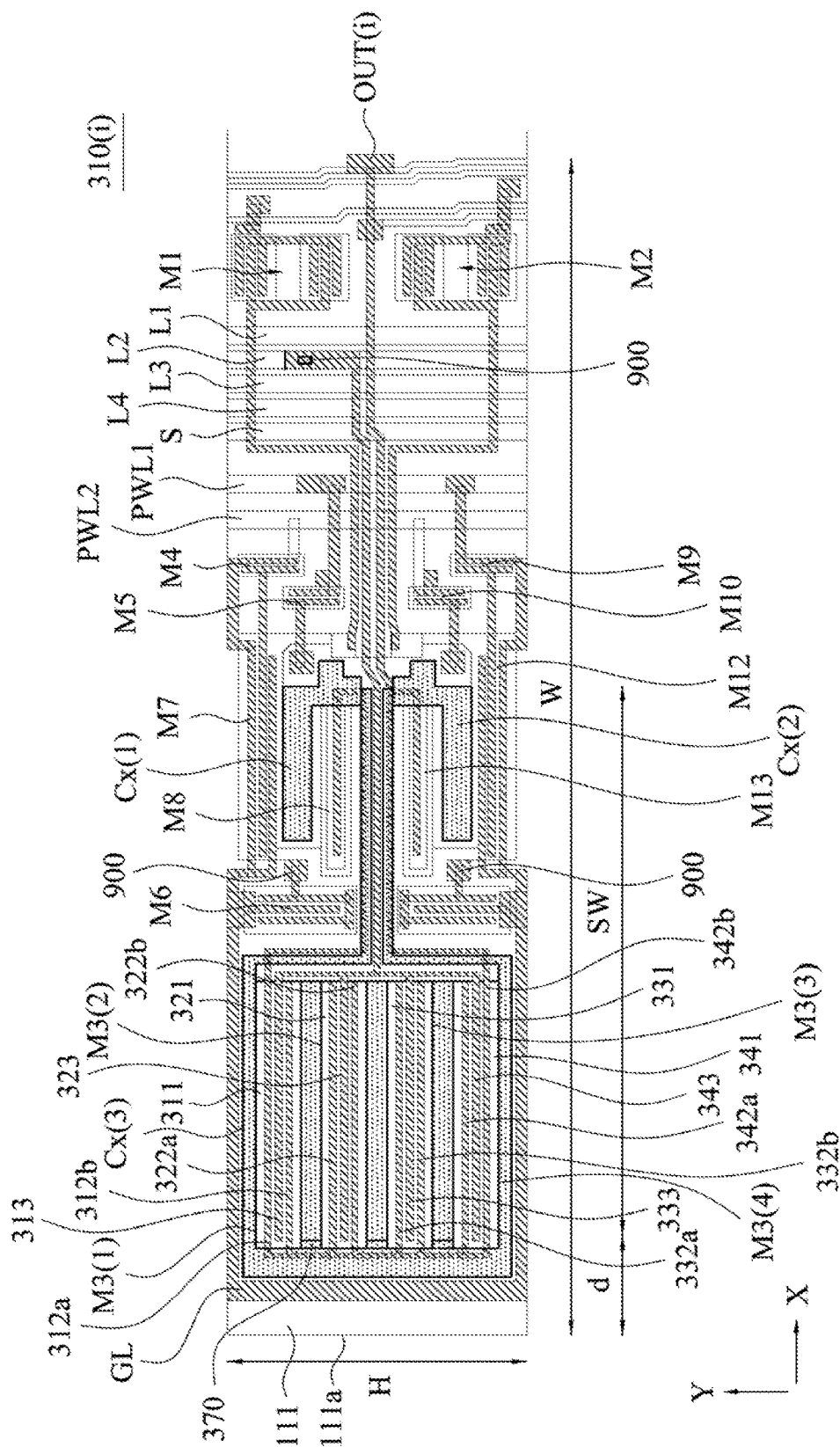
FIG. 11 illustrates another layout diagram of the $i^{th}$ stage shift register circuit in FIG. 4.

Next, referring to FIGS. 10A-10B and 11, in which FIGS. 10A-10B illustrate another layout diagram of the $i^{th}$ stage shift register circuit 310(i) in FIG. 4, and FIG. 11 illustrates another layout diagram of the $i^{th}$ stage shift register circuit 310(i) in FIG. 4. The difference between FIGS. 10A-10B is that FIG. 10B further illustrates the layout diagram of the drain/source of the TFT T3 and the connecting lines for electrically connecting the drain/source. In FIGS. 10A-10B and 11, the grounding line GL (which is configured to provide the reference voltage level VGL) is located nearby the side 111a of the first substrate 111 and extends along the first direction, and the output terminal of the $i^{th}$ shift register circuit 310(i) (which outputs the scan signal OUT(i)) is located nearby the display region AA. The clock signal lines L1-L4, the starting signal line S and the control signal lines PWL1 and PWL2 (which respectively output the pull-down control signals GPW1 and GPW2) are located between the TFTs M4 and M9 and the TFTs M1 and M2. The TFTs M1-M13 and the capacitor Cx are located between the grounding line GL and the display region AA. In some embodiments, the distance between the clock signal lines L1-L4 and the side 111a of the first substrate 111 is at least 600 micrometers, such that the distance between connecting structures 900 on the clock signal lines L1-L4 for electrically connecting the drains of the TFTs M3(1)-M3(4) and the side 111a of the first substrate 111 is at least 600 micrometers.

The capacitor Cx includes sub-capacitors Cx(1)-Cx(3) coupled to each other. The sub-capacitor Cx(1) is located in the space defined by the TFTs M5-M8, the sub-capacitor Cx(2) is located in the space defined by the TFTs M10-M13, and the sub-capacitor Cx(3) is partially located in the space defined by the TFTs M3(1)-M3(4).

In some embodiments, as shown in FIGS. 10B and 11, the sources 312a, 312b, 322a, 322b, 332a, 332b, 342a and 342b and the drains 313, 323, 333 and 343 of the TFTs M3(1)-M3(4) extend along a second direction. Similarly, in the embodiments of FIGS. 10B and 11, the first direction is perpendicular to the second direction, but the invention is not limited thereto. The angle between the extending direction of the clock signal lines L1-L4 and the extending direction of the sources 312a, 312b, 322a, 322b, 332a, 332b, 342a and 342b and the drains 313, 323, 333 and 343 of the TFTs M3(1)-M3(4) is preferably between 80° and 100°; that is, the angle between the first direction and the second direction is between 80° and 100°.

As shown in FIGS. 10A, 10B and 11, in the direction perpendicular to the first substrate 111, the capacitor Cx (including the sub-capacitors Cx(1)-Cx(3)) and the TFTs M1-M13 are non-overlapped, and a partial structure of the capacitor Cx is arranged in a space defined by multiple TFTs (e.g. the space defined by the TFTs M5-M8) or in a space between two adjacent TFTs (i.e. the gap between adjacent TFTs, such as the gap between the adjacent TFTs M8 and M13 or the gap between the adjacent TFTs M3(1) and M3(2), between TFTs M3(2) and M3(3) or between TFTs M3(3) and M3(4)). The area of the capacitor Cx can be increased by utilizing the layout design shown in FIGS. 10A-10B and 11. In addition, the curing effect of the photo-curable sealant 230 can be improved because the electrodes of the capacitor Cx are formed of transparent conductive material. That is, when light illuminates from the lower side of the display device 100, the percentage of light penetrating through the driving circuit 210 can be increased, so as to ensure that the photo-curable sealant 230 can be completely cured for preventing external moisture from permeating through the incompletely cured photo-curable sealant 230 and then eroding the driving circuit 210 and/or the components in the display region AA. Moreover, the capacitance of the capacitor Cx can also be increased by utilizing the layout design shown in FIGS. 10A-10B and 11.

In addition, as shown in FIGS. 10A-10B and 11, the TFTs M3(1)-M3(4), M6-M8 and M11-M13 and the sub-capacitors Cx(1)-Cx(3) are located in the coating area of the photo-curable sealant 230, i.e., the TFTs M3(1)-M3(4), M6-M8 and M11-M13 and the sub-capacitors Cx(1)-Cx(3) are all covered by the photo-curable sealant 230, in order to block moisture by the cured photo-curable sealant 230 from eroding the electrical component in the shift register circuit 310($i$) or in the area surrounded by the photo-curable sealant 230, etc. Similar to the embodiments of FIGS. 5A-5B and 6, the range of the coating area of the photo-curable sealant 230 is not limited to that illustratively shown in FIGS. 10A-11B and 11, i.e., the invention does not limit the gap d from the photo-curable sealant 230 to the side 111$a$ of the first substrate 111 and the coating area width SW of the photo-curable sealant 230.

Figure 12:
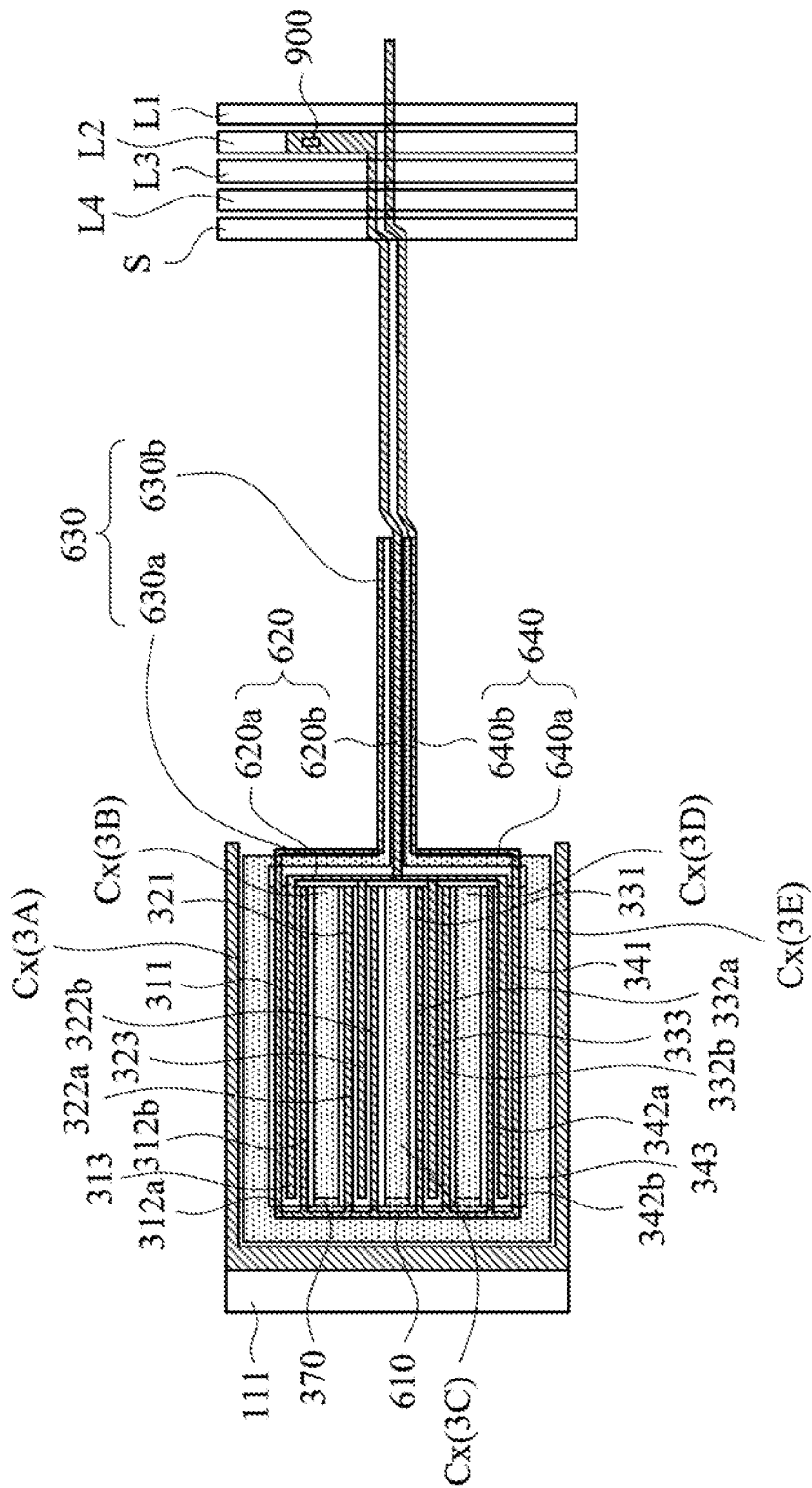
FIG. 12 illustrates a local enlarged view of the $i^{th}$ stage shift register circuit in FIG. 11.

Also referring to FIGS. 10B, 11 and 12, in which FIG. 12 is a local enlarged view of the TFTs M3(1)-M3(4), the clock signal lines L1-L4 and the capacitor Cx in FIG. 11. The TFTs M3(1)-M3(4) include the gates 311, 321, 331 and 341, the sources 312$a$, 312$b$, 322$a$, 322$b$, 332$a$, 332$b$, 342$a$ and 342$b$ and the drains 313, 323, 333 and 343, respectively. Similar to the embodiments of FIGS. 5B, 6 and 7, in the embodiments of FIGS. 10B, 11 and 12, the drains 313, 323, 333 and 343 of the TFTs M3(1)-M3(4) are located between the adjacent sources 312$a$ and 312$b$, between the adjacent sources 322$a$ and 322$b$, between the adjacent sources 332$a$ and 332$b$ and between the adjacent sources 342$a$ and 342$b$, respectively. The TFTs M3(1)-M3(4) are electrically connected in parallel and are arranged in sequence along the first direction, in which the sources 312$a$, 312$b$, 322$a$, 322$b$, 332$a$, 332$b$, 342$a$ and 342$b$ of the TFTs M3(1)-M3(4) are coupled with each other through a first connecting line 610, the drains 313, 323, 333 and 343 of the TFTs M3(1)-M3(4) are coupled with each other through a first portion 620$a$ of a second connecting line 620, and the gates 311, 321, 331 and 341 of the TFTs M3(1)-M3(4) are coupled with each other by the connecting portion 370. The gates 311, 321, 331 and 341 of the TFTs M3(1)-M3(4) are coupled to the node P1, while the sources 312$a$, 312$b$, 322$a$, 322$b$, 332$a$, 332$b$, 342$a$ and 342$b$ of the TFTs M3(1)-M3(4) are coupled to the node P2, in which the nodes P1, P2 respectively correspond to the two electrodes of the capacitor Cx. The drains 313, 323, 333 and 343 of the TFTs M3(1)-M3(4) are coupled to one of the clock signal lines L1-L4 (in FIGS. 10B-12, the drains 313, 323, 333 and 343 are coupled to the clock signal line L2 for illustration) to receive the clock signal CN. In addition, the sub-capacitor Cx(3) is composed of capacitor branches Cx(3A)-Cx(3E) which are coupled to each other. The capacitor branch Cx(3B) is located between the TFTs M3(1) and M3(2), the capacitor branch Cx(3C) is located between the TFTs M3(2) and M3(3), and the capacitor branch Cx(3D) is located between the TFTs M3(3) and M3(4).

In this embodiment, the clock signal lines L1-L4, the gates 311, 321, 331 and 341 of the TFTs M3(1)-M3(4) and the connecting portion 370 are formed from a first layer, and the sources 312$a$, 312$b$, 322$a$, 322$b$, 332$a$, 332$b$, 342$a$ and 342$b$ and the drains 313, 323, 333 and 343 of the TFTs M3(1)-M3(4), the first connecting line 610 and the second connecting line 620 are formed from a second metal layer. As shown in FIGS. 10B and 12, the drains 313, 323, 333 and 343 of the TFTs M3(1)-M3(4) extend towards the display region AA through a second portion 620$b$ of the second connecting line 620 to be coupled to one of the clock signal lines L1-L4, the clock signal lines L1-L4 and the second connecting line 620 respectively belong to the first metal layer and the second metal layer, and the clock signal lines L1-L4 and the second connecting line 620 are electrically connected by the connecting structure 900.

Referring to FIGS. 5B and 10B. In FIG. 5B, the drains 313, 323, 333, 343 of the TFTs M3(1)-M3(4) are coupled with each other through the first portion 360$a$ of the second connecting line 360, and the second portion 360$b$ of the second connecting line 360 extends towards the side 111$a$ of the first substrate 111 for being electrically connected to one of the clock signal lines L1-L4 by the connecting structure 700. The sources 312$a$, 312$b$, 322$a$, 322$b$, 332$a$, 332$b$, 342$a$ and 342$b$ of the TFTs M3(1)-M3(4) are coupled to each other through the first portion 350$a$ of the first connecting line 350, and the second portion 350$b$ of the first connecting line 350 extends towards the display region AA of the first substrate 111 and to the node P2. In FIG. 10B, the drains 313, 323, 333 and 343 of the TFTs M3(1)-M3(4) are coupled with each other through the first portion 620$a$ of the second connecting line 620, and the second portion 620$b$ of the second connecting line 620 extends towards the display region AA for being electrically connected to one of the clock signal lines L1-L4 through the connecting structure 900. The left ends of the sources 312$a$, 312$b$, 322$a$, 322$b$, 332$a$, 332$b$, 342$a$ and 342$b$ of the TFTs M3(1)-M3(4) are coupled to each other through the first connecting line 610. The right end of the source 312$a$ of the TFT M3(1) is coupled to a third connecting line 630 which includes a first portion 630$a$ extending downwards and a second portion 630$b$ extending towards the display region AA. The right end of the source 342$a$ of the TFT M3(4) is coupled to a fourth connecting line 640 which includes a first portion 640$a$ extending upwards and a second portion 640$b$ extending towards the display region AA. The sources 312$a$, 312$b$, 322$a$, 322$b$, 332$a$, 332$b$, 342$a$ and 342$b$, the drains 313, 323, 333 and 343, the first connecting line 610, the second connecting line 620, the third connecting line 630 and the fourth connecting line 640 belong to the second metal layer. In comparison with the embodiments of FIG. 5B, by utilizing the unique layout of the TFTs M3(1)-M3(4) and the connecting lines 610-640 in FIG. 10B and arranging the clock signal lines L1-L4 between the TFTs M3(1)-M3(4) and the display region AA, no connecting structure exists between the side 111$a$ of the first substrate 111 and the TFTs M3(1)-M3(4) and in the layout area of the M3(1)-M3(4), and therefore, in this embodiment, the connecting structure 900 in the layout area of the shift register circuit 310($i$) can be away from the side 111$a$ of the first substrate 111, such that the connecting structure 900 can be prevented from being eroded by external moisture. For illustration, in the layout area of the shift register circuit 310($i$), in addition to the connecting structure 900 for electrically connecting the clock signal lines L1-L4 and the second connecting line 620, the layout area of TFTs M4-M13 further includes connecting structures 900 for coupling different TFTs (e.g. the connecting structure 900 coupling the drain of the TFT M6 and the gate of the TFT M7 in FIG. 11). By arranging the clock signal lines L1-L4 between the TFTs M3(1)-M3(4) and the display region AA and applying the layout in which no connecting structure is arranged in the layout area of the TFTs M3(1)-M3(4), the connecting structure 900 in the layout area of the shift register circuit 310($i$) can be away from the side 111$a$ of the first substrate 111, such that the connecting structure 900 can be prevented from being eroded by external moisture.

In the shift register circuit layout of FIGS. 5B and 6, the clock signal lines L1-L4 are located between the side 111$a$ of the first substrate 111 and the TFTs M3(1)-M3(4), while in the shift register circuit layout of FIGS. 10B and 11, the clock signal lines L1-L4 are located between the TFTs M3(1)-M3(4) and the display region AA. Thus, the connecting structure 700 for connecting the clock signal lines L1-L4 and the second connecting line 360 in the embodiment of FIGS. 5B and 6 is closer to the side 111a of the first substrate 111 to the connecting structure 900 for connecting the clock signal lines L1-L4 and the second connecting line 620 in the embodiment of FIGS. 10B and 11.

It is note that, the layout of FIGS. 10A-10B and 11, in which the clock signal lines L1-L4 are located between the TFTs M4 and M9 and the TFTs M1 and M2 is merely for illustration, but is not intended to limit the scope of the invention. Those ordinary skill in the art may modify the position of the clock signal lines L1-L4 between the TFTs M3(1)-M3(4) and the display region AA in accordance with the layout requirements of the shift register circuit 310(i). For illustration, the clock signal lines L1-L4 may be located between the TFTs M3(1)-M3(4) and the TFTs M6 and M11, and because there is no connecting structure between the side 111a of the first substrate 111 and the TFTs M3(1)-M3(4) and in the layout area of the TFTs M3(1)-M3(4), such that the connecting structure in the layout area of the shift register circuit 310(i) can be away from the side 111a of the first substrate 111 for preventing from being eroded by external moisture.

Figure 13:
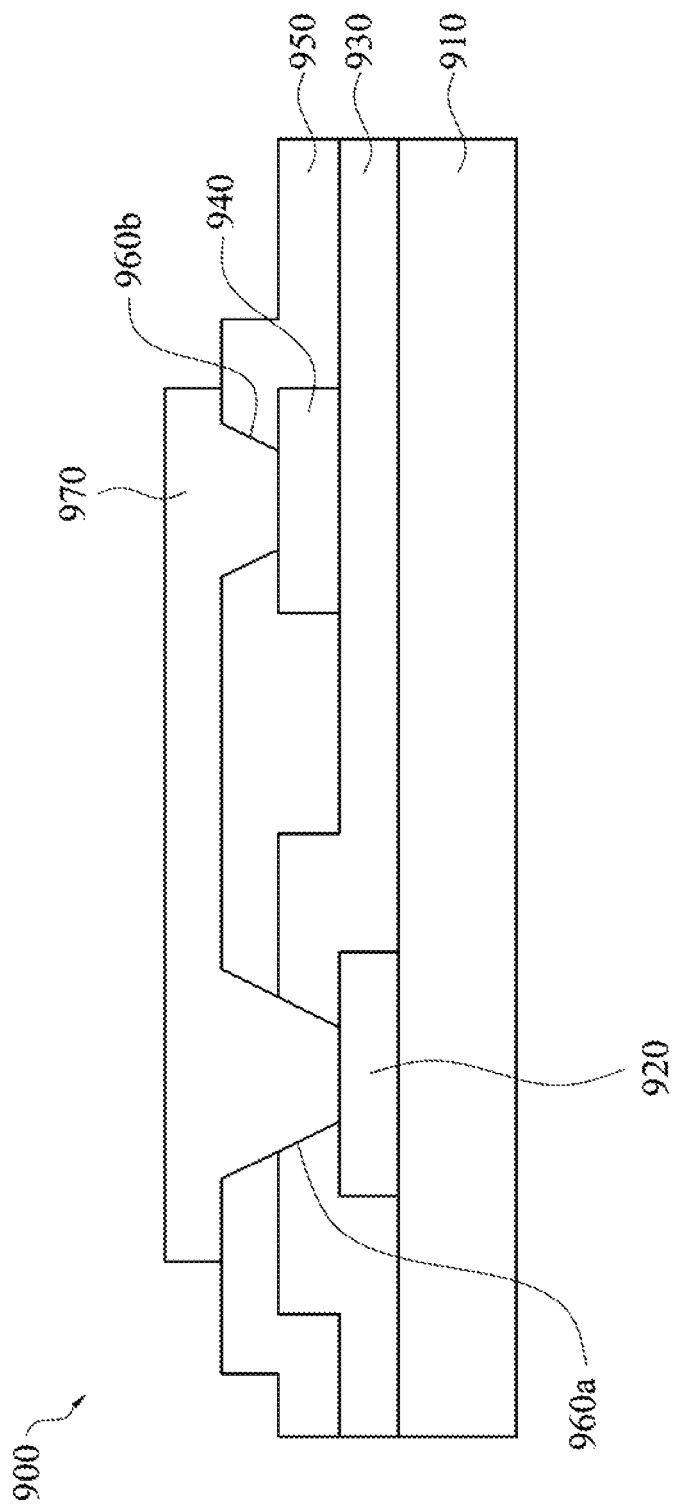
FIG. 13 illustrates a cross sectional diagram of the connecting structure in FIG. 11.

Referring to FIG. 13, FIG. 13 illustrates a cross sectional diagram of the connecting structure 900. The connecting structure 900 can be, for example, a contacting point of the clock signal line L1 and the 1$^{st}$ stage shift register circuit 310(1) or a contacting point of the starting signal line S and the 2$^{nd}$ stage shift register circuit 310(2) shown in FIG. 3. As shown in FIG. 13, a first metal layer 920 is formed on a substrate 910, and then a gate insulating layer 930 is deposited on the substrate 910 and the first metal layer 920. Subsequently, a second metal layer 940 is formed on the gate insulating layer 930, and then a passivation layer 950 is formed on the gate insulating layer 930 and the second metal layer 940. Then, through-holes 960a and 960b are formed in the gate insulating layer 930 and the passivation layer 950 by an etching process, in order to respectively expose the first metal layer 920 and the second metal layer 940. Finally, a transparent conductive layer 970 is formed on the first metal layer 920, the second metal layer 940 and the passivation layer 950, and the transparent conductive layer 970 fills in the through-holes 960a and 960b for electrically connecting the first metal layer 920 and the second metal layer 940 in a bridge manner.

In FIG. 13, the substrate 910 corresponds to the first substrate 111 in FIGS. 10A-10B and 11, the first metal layer 920 and the second metal layer 940 may be formed by the same process as that for forming the gate and source/drain of the TFTs M1-M13 in FIGS. 10A-10B and 11, the transparent conductive layer 970 may be formed by the same process as that for forming the electrodes of the capacitor Cx in FIG. 4, and the first metal layer 920 and the second metal layer 940 is coupled via the transparent conductive layer 970 rather than direct contact. In FIG. 13, although the transparent conductive layer 970 for coupling the first metal layer 920 and the second metal layer 940 is not covered by the passivation layer 950, the connecting structure 900 of the shift register circuit 300(i) is arranged away from the side 111a of the first substrate 111, and thus the connecting structure 900 can be prevented from being eroded by external moisture. In comparison with the connecting structure 700 of FIG. 9, the connecting structure 900 of FIG. 13 can be formed through fewer process steps, and thus the layout of the shift register circuit 310(i) in the embodiments of FIGS. 10A-10B and 11 collocated with the connecting structure 900 can subsequently reduce manufacturing cost.

It is noted that the layout of the shift register circuit 310(i) in the embodiments of FIGS. 5A-5B and 6 collocated with the connecting structure 700 in FIG. 9 and the layout of the shift register circuit 310(i) in the embodiments of FIGS. 10A-10B and 11 collocated with the connecting structure 900 in FIG. 13 are merely for illustration and are not intended to limit the scope of the invention. Those skilled in the art may adjust the layout of the shift register circuit 310(i) in accordance with process requirements, material of the photo-curable sealant and coating locations. For example, the layout of the shift register circuit 310(i) in the embodiments of FIGS. 5A-5B and 6 may be collocated with the connecting structure 900 in FIG. 13, and the layout of the shift register circuit 310(i) in the embodiments of FIGS. 10A-10B and 11 may be collocated with the connecting structure 700 in FIG. 9.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A driving circuit disposed on a substrate of a display device, the substrate having a display region and a non-display region, wherein the driving circuit is disposed in the non-display region, and the driving circuit comprising:

1$^{st}$ to N$^{th}$ stage shift registers, wherein a pull-up unit of an i$^{th}$ stage shift register comprises a transistor and a capacitor, the transistor of the pull-up unit comprises M number of thin film transistors (TFTs), each of the TFTs having a gate, at least one source and at least one drain, wherein i is an integer greater than or equal to 1 and is smaller than or equal to N, and M is an integer greater than or equal to 2; and a plurality of clock signal lines extending along a first direction, wherein the drains of the M number of TFTs of the i$^{th}$ stage shift register are electrically connected to a corresponding clock signal line through a connecting line for receiving a clock signal, and the sources and the drains of the M number of TFTs extend along a second direction, and an angle between the first direction and the second direction is between 80 degrees and 100 degrees, and wherein the clock signal lines and the drains of the M number of TFTs are formed from different metal layers, wherein the M number of TFTs are sequentially disposed along the first direction, and a gate, a source and a drain of the (j−1)$^{th}$ TFT are electrically connected to a gate, a source and a drain of the j$^{th}$ TFT respectively, and the capacitor is at least partially located in a gap between the (j−1)$^{th}$ and j$^{th}$ TFTs, and wherein N is an integer greater than or equal to 2, and j is an integer greater than or equal to 2 and smaller than or equal to M.

2. The driving circuit of claim 1, wherein the first direction is substantially perpendicular to the second direction.

3. The driving circuit of claim 1, wherein each of the M number of TFTs comprises a gate, two sources and a drain, and wherein the sources are respectively disposed at two opposite sides of the drain.

4. The driving circuit of claim 1, wherein the gate and the source of each of the M number of TFTs are respectively electrically connected to a first electrode and a second electrode of the capacitor.

5. The driving circuit of claim 4, wherein the first electrode and the second electrode include a transparent conductive material.

6. The driving circuit of claim 5, wherein the transparent conductive material comprises indium tin oxide (ITO), indium zinc oxide (IZO) or tin oxide.

7. The driving circuit of claim 1, wherein the $i^{th}$ stage shift register further comprises a pre-charge unit and at least one pull-down unit, and a distance between the M number of TFTs and the display region is longer than a distance between the pre-charge unit and the display region and is longer than a distance between the pull-down unit and the display region.

8. The driving circuit of claim 1, wherein the clock signal lines are disposed between a side of the substrate and the M number of TFTs.

9. The driving circuit of claim 1, wherein the clock signal lines are disposed between the M number of TFTs and the display region.

10. The driving circuit of claim 9, wherein the connecting line and one of the clock signal lines are electrically connected by a connecting structure, and a distance between the connecting structure and a side of the substrate is at least 600 micrometers, and the connecting structure is configured to electrically connect different metal layers.

11. The driving circuit of claim 10, wherein the connecting structure comprises a transparent conductive layer, and the clock signal lines are formed from a first metal layer, and the first connecting line is formed from a second metal layer, and the transparent conductive layer is electrically connected to the first connecting line and one of the clock signal lines.

12. The driving circuit of claim 9, wherein the connecting line has a first portion coupled to the drains of the M number of TFTs and a second portion extending towards the display region to electrically connect one of the clock signal lines.

13. The driving circuit of claim 12, further comprising another connecting line, the another connecting line having a first portion coupled to the source of one of the M number of TFTs and a second portion extending towards the display region.

14. The driving circuit of claim 12, further comprising another connecting line, wherein the another connecting line is coupled to the sources of the M number of TFTs.

15. A display device, comprising:
a first substrate having a display region and a non-display region;
a driving circuit disposed in the non-display region and comprising:
$1^{st}$ to $N^{th}$ stage shift registers, wherein a pull-up unit of an $i^{th}$ stage shift register comprises a transistor and a capacitor, the transistor of the pull-up unit comprises M number of thin film transistors (TFTs), each of the TFTs having a gate, at least one source and at least one drain, and wherein i is an integer greater than or equal to 1 and is smaller than or equal to N, and M is an integer greater than or equal to 2; and
a plurality of clock signal lines extending along a first direction, wherein the drains of the M number of TFTs of the $i^{th}$ stage shift register are electrically connected to a corresponding clock signal line through a connecting line for receiving a clock signal, the sources and the drains of the M number of TFTs extend along a second direction, and wherein an angle between the first direction and the second direction is between 80 degrees and 100 degrees, and wherein the clock signal lines and the drains of the M number of TFTs are formed from different metal layers;
a second substrate disposed opposite to the first substrate, the second substrate having a non-transparent region; and
a sealant disposed between the first substrate and the second substrate,
wherein the sealant, the driving circuit and the non-transparent region are at least partially overlapped in a direction perpendicular to the first substrate or the second substrate,
wherein the M number of TFTs are sequentially disposed along the first direction, and a gate, a source and a drain of the $(j-1)^{th}$ TFT are electrically connected to a gate, a source and a drain of the $j^{th}$ TFT respectively, and the capacitor is at least partially located in a gap between the $(j-1)^{th}$ and $j^{th}$ TFTs, and wherein N is an integer greater than or equal to 2, and j is an integer greater than or equal to 2 and smaller than or equal to M.

16. The display device of claim 15, wherein the M number of TFTs and the sealant are overlapped.

17. The display device of claim 16, wherein the clock signal lines are disposed between a side of the first substrate and the M number of TFTs.

18. The display device of claim 16, wherein the clock signal lines are disposed between the M number of TFTs and the display region.

19. The display device of claim 15, wherein the capacitor is coupled to the M number of TFTs and comprises a first electrode and a second electrode, and wherein the first electrode and the second electrode include a transparent conductive material.

* * * * *